US008409910B2

(12) United States Patent  (10) Patent No.: US 8,409,910 B2
Ogawa  (45) Date of Patent: Apr. 2, 2013

(54) OPTICAL SENSOR AND METHOD FOR MAKING THE SAME

(75) Inventor: Kazufumi Ogawa, Awa (JP)

(73) Assignee: Empire Technology Development LLC, Wilmington, DE (US)

( * ) Notice: Subject to any disclaimer, the term of this patent is extended or adjusted under 35 U.S.C. 154(b) by 544 days.

(21) Appl. No.: 12/593,574

(22) PCT Filed: Mar. 24, 2008

(86) PCT No.: PCT/JP2008/055431
§ 371 (c)(1),
(2), (4) Date: Oct. 27, 2009

(87) PCT Pub. No.: WO2008/123194
PCT Pub. Date: Oct. 16, 2008

(65) Prior Publication Data
US 2010/0117065 A1  May 13, 2010

(30) Foreign Application Priority Data
Mar. 31, 2007  (JP) .................................. 2007-095875

(51) Int. Cl.
 *H01L 21/00*  (2006.01)
 *H01L 51/42*  (2006.01)
(52) U.S. Cl. ............... 438/82; 257/40; 257/461; 438/99
(58) Field of Classification Search ............. 257/40, 257/461; 438/82, 99
See application file for complete search history.

(56) References Cited

FOREIGN PATENT DOCUMENTS

| JP | 07-142757 A | 6/1995 |
|---|---|---|
| JP | 10-045409 A | 2/1998 |
| JP | 2002-270923 A | 9/2002 |
| JP | 2007-173516 A | 7/2007 |
| JP | 2007-173517 A | 7/2007 |
| JP | 2007-173518 | * 7/2007 |
| JP | 2007-173518 A | 7/2007 |
| WO | WO2008/123194 A1 | 10/2008 |

OTHER PUBLICATIONS

International Search Report for PCT/JP2008/055431 mailed Jun. 24, 2008 (with English translation).

(Continued)

*Primary Examiner* — Zandra Smith
*Assistant Examiner* — Jamie C Niesz
(74) *Attorney, Agent, or Firm* — Foley & Lardner LLP

(57) ABSTRACT

An optical sensor that can be produced at a low cost from inexpensive silicon fine particles as raw materials and a method for making the optical sensor are provided.
In an optical sensor 1, a layer of n-type silicon fine particles 24 coated with a coating film having a functional group is selectively fixed and bonded onto only a pattern portion of a surface of a transparent electrode 14 coated with a coating film having a first functional group, and a layer of p-type silicon fine particles 25 coated with a coating film having a third functional group is fixed and bonded thereon. The first and second functional groups and the second and third coupling groups are respectively fixed with each other via bonds formed between them and coupling reactive groups in a coupling agent.

26 Claims, 6 Drawing Sheets

● INDICATED BY (A) IN THE DRAWING REPRESENTS 2-METHYLIMIDAZOLE

OTHER PUBLICATIONS

International Preliminary Report on Patentability for PCT/JP2008/055431 mailed Oct. 22, 2009 (English translation).

Cederberg, J. G., and Shaner, E.A., "Self-assembled Quantum Dots for Detectors and Emitters in the Long-wavelength Infrared," Nanoelectronics & Nitride Semiconductors, pp. 18-19.

Taylor, E.W., "The role of nanostructures and quantum dots in detectors and solar cells for radiation hardened space applications," Proceedings of the SPIE: Photonics for space environments. Conference No. 11, vol. 6308, pp. 630807.1-630807.11 (2006).

* cited by examiner

INDICATED BY (A) IN THE DRAWING REPRESENTS 2-METHYLIMIDAZOLE

INDICATED BY (A) IN THE DRAWING REPRESENTS 2-METHYLIMIDAZOLE (A)

(B)

(A)

HERE, ⬤— REPRESENTS $H_2C-CH-O-(CH_2)_3-Si-O-$ with epoxide O bridge and additional O— groups on Si (B)

HERE, ⬤— REPRESENTS A MOLECULE FORMED BY RING-OPENING POLYMERIZATION OF AN EPOXY GROUP

OPTICAL SENSOR AND METHOD FOR MAKING THE SAME

TECHNICAL FIELD

The present invention relates to an optical sensor and a method for making the optical sensor. In particular, it relates to an optical sensor (including an optical sensor array) in which silicon fine particle layers are selectively stacked to form a pattern by using fine particles prepared by imparting thermal reactivity, photoreactivity, ion reactivity, or radical reactivity to surfaces of semiconductor fine particles, and to a method for making such an optical sensor.

BACKGROUND ART

Amorphous silicon optical sensors prepared by forming films on surfaces of electrodes by plasma CVD techniques, silicon crystal optical sensors prepared by diffusing impurities into plates produced by cutting silicon single crystals or polycrystals, and the like are known as silicon optical sensors heretofore (e.g., refer to Patent Document 1).
[Patent Document 1] Japanese Unexamined Patent Application Publication No. 7-142757

DISCLOSURE OF INVENTION

Problems to be Solved by the Invention

However, production of amorphous silicon optical sensors has a problem in that it requires expensive vacuum apparatuses. Moreover, production of silicon crystal optical sensors requires large quantities of high-purity silicon single crystals or polycrystals, which leads to a problem of high production cost.

The present invention in view of solving the above-described problems aims to provide an optical sensor that can be manufactured at a lower cost than existing amorphous silicon or silicon crystal optical sensors, by using a semiconductor material such as silicon or the like, and a method for making such an optical sensor.

Means for Solving the Problems

An optical sensor according to a first invention is characterized in that one layer of n-type semiconductor fine particles coated with a coating film composed of a second film compound containing a second functional group is fixed and bonded only on a pattern portion of a surface of a substrate coated with a coating film composed of a first film compound having a first functional group, and one layer of p-type semiconductor fine particles coated with a coating film composed of a third film compound having a third functional group is fixed and bonded on the layer of the n-type semiconductor fine particles, in which the coated n-type semiconductor fine particles are fixed and bonded via bonds formed by coupling reaction of the first and second functional groups with a first coupling agent having at least one first coupling reactive group that forms a bond with the first functional group through coupling reaction and at least one second coupling reactive group that forms a bond with the second functional group through coupling reaction, and in which the coated p-type semiconductor fine particles are fixed and bonded via bonds formed by coupling reaction of the second and third functional groups with a second coupling agent having at least one second coupling reactive group that forms a bond with the second functional group through coupling reaction and at least one third coupling reactive group that forms a bond with the third functional group through coupling reaction.

Here, "optical sensor" means any desired element that has photoelectromotive force, e.g., a solar battery, a photo diode, or a photoelectric conversion element.

Note that "coupling reaction" means any reaction that occurs by addition reaction or condensation reaction between functional groups and may be induced by light or heat.

In the optical sensor of a first invention, the surface of the coating film composed of the first film compound on the surface of the substrate may be further coated with a coating film composed of the first coupling agent bonded by coupling reaction between the first functional group and the first coupling reactive group, and the surface of the coating film composed of the third film compound on the surfaces of the p-type semiconductor fine particles may be further coated with a coating film composed of the second coupling agent bonded by coupling reaction between the third functional group and the third coupling reactive group.

In the optical sensor of the first invention, the surface of the coating film composed of the second film compound on the surfaces of the n-type semiconductor fine particles may be further coated with a coating film composed of the first coupling agent bonded by coupling reaction between the second functional group and the second coupling reactive group.

In the optical sensor of the first invention, the first to third film compounds are preferably the same compound since production costs for solar batteries can be reduced.

All of the coating films composed of the first to third film compounds are preferably monomolecular films since internal resistance of the optical sensor can be reduced without damaging the properties of silicon fine particles.

In an optical sensor of a second invention, first to x-th (x is an integer more than 1) semiconductor fine particle layers composed of n-type semiconductor fine particles are sequentially stacked in order only on a pattern portion of a surface of a substrate coated with a coating film composed of a first film compound having a first functional group, in a direction from the coated substrate side toward a rear electrode side; and then up to an y-th (y is an integer satisfying $y \geq x+1$) semiconductor fine particle layers composed of n-type semiconductor fine particles are sequentially stacked thereon in order; and surfaces of the coated semiconductor fine particles constituting an m-th (m is an integer satisfying $1 \leq m \leq y$) semiconductor fine particle layer are coated with a coating film composed of an m-th film compound having an (m+1)-th functional group; and an (m−1)-th semiconductor fine particle layer and the m-th semiconductor fine particle layer are fixed to each other via bonds formed by coupling reactions between a m-th functional group and a m-th coupling reactive group, and between a (m+1)-th functional group and a (m+1)-th coupling reactive group, using an m-th coupling agent having at least one m-th coupling reactive group that forms a bond with the m-th functional group by coupling reaction and at least one (m+1)-th coupling reactive group that forms a bond with the (m+1)-th functional group.

In the optical sensor of the second invention, the first to (y+1)-th film compounds are preferably the same compound and the first to y-th coupling agents are preferably the same compound since production costs for solar batteries can be reduced.

All of the coating films composed of the first to (y+1)-th film compounds are preferably monomolecular films since internal resistance of the optical sensor can be reduced without damaging the properties of the silicon fine particles.

In the optical sensors of the first and second inventions, the bonds formed by the coupling reaction may be N—CH$_2$CH(OH) bonds formed by reaction of amino or imino groups with epoxy groups.

In the optical sensors of the first and second inventions, the bonds formed by the coupling reaction may be NH—CONH bonds formed by reaction of amino or imino groups with isocyanate groups.

According to a third invention, a method for making an optical sensor in which a first fine particle layer composed of aligned n-type semiconductor fine particles coated with a coating film composed of a second film compound containing a second functional group and a second bonding group at respective two ends of the molecule is bonded and fixed on only a pattern portion of a surface of a substrate coated with a coating film composed of a first film compound having a first functional group and a first bonding group at respective two ends of the molecule and in which a second fine particle layer composed of aligned p-type semiconductor fine particles coated with a coating film composed of a third film compound having a third functional group and a third bonding group at respective two ends of the molecule is formed on the first fine particle layer, includes step A of bringing a solution containing the first film compound into contact with a surface of a substrate so as to form bonds between the first bonding group and the surface of the substrate to thereby prepare a coated substrate in which a surface of the substrate is coated with a coating film composed of the first film compound; step B of performing a pattern forming process by irradiating the surface of the coated substrate with an energy beam through a mask that covers a pattern portion so as to allow the coating film composed of the first film compound to remain only on the pattern portion; step C of bringing a solution containing the second film compound containing the second functional group into contact with surfaces of n-type semiconductor fine particles so as to form bonds between the second bonding group and the surface of the first fine particles to thereby prepare coated n-type semiconductor fine particles in which the surfaces of the n-type semiconductor fine particles are coated with a coating film composed of the second film compound; step D of bringing a solution containing the third film compound into contact with surfaces of p-type semiconductor fine particles so as to form bonds between the third bonding group and the surfaces of the p-type semiconductor fine particles to thereby prepare coated p-type semiconductor fine particles in which the surfaces of the p-type semiconductor fine particles are coated with a coating film composed of the third film compound; step E of bringing a first coupling agent having at least one first coupling reactive group that forms a bond by coupling reaction with the first functional group and at least one second coupling reactive group that forms a bond by coupling reaction with the second functional group into contact with surfaces of the coated substrate and the coated n-type semiconductor fine particles so as to form bonds by coupling reaction between the first functional group and the first coupling reactive group and by coupling reaction between the second functional group and the second coupling reactive group to thereby fix and bond one n-type semiconductor fine particle layer composed of the coated n-type semiconductor fine particles on the surface of the coated substrate, and removing the coated n-type semiconductor fine particles that remain unfixed on the surface of the coated substrate; step F of bringing a second coupling agent having at least one second coupling reactive group that forms a bond by coupling reaction with the second functional group and at least one third coupling reactive group that forms a bond by coupling reaction with the third functional group into contact with surfaces of the n-type semiconductor fine particle layer and the coated p-type semiconductor fine particles so as to form bonds by coupling reaction between the second functional group and the second coupling reactive group and by coupling reaction between the third functional group and the third coupling reactive group to thereby fix and bond one p-type semiconductor fine particle layer composed of the coated p-type semiconductor fine particles on the n-type semiconductor fine particle layer, and removing the coated p-type semiconductor fine particles that remain unfixed on the surface of the n-type semiconductor fine particle layer; and step G of forming a rear electrode on the p-type semiconductor fine particle layer.

In the method for making the optical sensor of the third invention, in the pattern forming process in step B, the coating film of the first film compound may be removed from portions other than the pattern portion by a laser ablation technique.

In the method for making the optical sensor of the third invention, the pattern forming process in step B may be performed by converting the first functional group in portions other than the pattern portion into a different functional group by irradiation with the energy beam.

In the method for making the optical sensor of the third invention, in step E, the first coupling agent may be first brought into contact with the coated surface of the coated substrate so as to prepare a reactive substrate having a coating film composed of the first coupling agent, and then the coated n-type semiconductor fine particles may be brought into contact with the surface of the reactive substrate so as to fix the coated n-type semiconductor fine particles on the surface of the reactive substrate. In step F, the second coupling agent may be first brought into contact with the coated p-type semiconductor fine particles so as to prepare reactive p-type semiconductor fine particles having a coated film of the second coupling agent, and then the reactive p-type semiconductor fine particles may be brought into contact on the coated n-type semiconductor fine particles so as to fix the reactive p-type semiconductor fine particles.

In the method for making the optical sensor of the third invention, in step E, the first coupling agent may be first brought into contact with the surfaces of the n-type semiconductor fine particles so as to prepare reactive n-type semiconductor fine particles having a coating film of the first coupling agent, and then the surfaces of the reactive n-type semiconductor fine particles may be brought into contact with the coated substrate so as to fix the reactive n-type semiconductor fine particles on the surface of the coated substrate. In step F, the coated p-type semiconductor fine particles may be brought into contact on the reactive n-type semiconductor fine particles so as to fix the reactive p-type semiconductor fine particles.

In the optical sensor of the third invention, the first to third film compounds are preferably the same compound since production costs for solar batteries can be reduced.

In the method for making the optical sensor of the third invention, in steps A, C, and D, the first to third film compounds that remain unreacted are preferably removed by washing and all of the coating films of the first to third film compounds are preferably monomolecular films since the internal resistance of the optical sensor can be reduced without damaging the properties of the silicon fine particles.

According to a fourth invention, a method for making an optical sensor in which first to x-th (X is an even integer of 2 or more) semiconductor fine particle layers composed of n-type semiconductor fine particles are sequentially stacked in order only on a pattern portion of a surface of a substrate coated with a coating film composed of a first film compound having a first functional group and a first bonding group at respective two ends of the molecule in a direction from the coated substrate side toward a rear electrode side; and in which up to y-th (y is an integer satisfying $y \geqq x+1$) semiconductor fine particle layers composed of p-type semiconductor fine particles are further sequentially stacked in order thereon up to includes step A of bringing a solution containing the first film compound into contact with a surface of a substrate so as to form bonds between the first bonding group and the surface of the substrate to thereby prepare a coated substrate in which the surface of the substrate is coated with a coating film composed of the first film compound; step B of performing a pattern forming process by irradiating the surface of the coated substrate with an energy beam through a mask that covers a pattern portion so as to allow the coating film composed of the first film compound to remain only on the pattern portion; step C of bringing a solution containing a second film compound having a second functional group and a second bonding group at respective two ends of the molecule into contact with surfaces of n-type semiconductor fine particles so as to form bonds between the second bonding group and the surfaces of the n-type semiconductor fine particles to thereby prepare coated n-type semiconductor fine particles in which surfaces of the n-type semiconductor fine particles are coated with a coating film composed of the second film compound; step D of bringing a solution containing the second film compound into contact with surfaces of p-type semiconductor fine particles so as to form bonds between the second bonding group and the surfaces of the p-type semiconductor fine particles to thereby prepare coated p-type semiconductor fine particles in which the surfaces of the p-type semiconductor fine particles are coated with a coating film composed of the second film compound; step E of bringing a first coupling agent having at least one first coupling reactive group that forms a bond by coupling reaction with the first functional group and at least one second coupling reactive group that forms a bond by coupling reaction with the second functional group into contact with the coated surface of the coated substrate so as to prepare a reactive substrate having a coating film of the first coupling agent; step F of bringing a solution containing a third film compound having a third functional group and a third bonding group at respective two ends of the molecule into contact with surfaces of n-type semiconductor fine particles so as to form bonds between the third bonding group and the surfaces of the n-type semiconductor fine particles and then bringing a second coupling agent having at least one second coupling reactive group that forms a bond by coupling reaction with the second functional group and at least one third coupling reactive group that forms a bond by coupling reaction with the third functional group into contact with the surfaces of the n-type semiconductor fine particles so as to prepare reactive n-type semiconductor fine particles having surfaces with a coating film composed of the second coupling agent, the coating film being fixed via bonds formed by coupling reaction between the third functional group and the third coupling reactive group; step G of bringing a solution containing a fourth film compound having a fourth functional group and a fourth bonding group at respective two ends of the molecule into contact with surfaces of p-type semiconductor fine particles so as to form bonds between the fourth bonding group and the surfaces of the p-type semiconductor fine particles and then bringing a third coupling agent having at least one second coupling reactive group that forms a bond by coupling reaction with the second functional group and at least one fourth coupling reactive group that forms a bond by coupling reaction with the fourth functional group into contact with the surfaces of the p-type semiconductor fine particles so as to prepare reactive p-type semiconductor fine particles having surfaces with a coating film composed of the third coupling agent, the coating film being fixed via bonds formed by coupling reaction between the fourth functional group and the fourth coupling reactive group; step H of alternately stacking the coated n-type semiconductor fine particles and the reactive n-type semiconductor fine particles on a surface of the reactive substrate and fixing them through coupling reaction between the second functional group and the second coupling reactive group so as to form first to x-th semiconductor fine particle layers composed of n-type semiconductor fine particles that are sequentially stacked in order; step I of alternately stacking the coated p-type semiconductor fine particles and the reactive p-type semiconductor particles on the fine particle layer of the reactive n-type semiconductor fine particles located on the top of the semiconductor fine particle films formed in step H and fixing them through coupling reaction between the second functional group and the second coupling reactive group so as to form (x+1)-th to y-th semiconductor fine particle layers composed of p-type semiconductor fine particles that are sequentially stacked in order; and step J of forming a rear electrode on the top of the semiconductor fine particle films formed in step I.

According to a fifth invention, a method for making an optical sensor in which first to x-th (X is an odd integer of 1 or more) semiconductor fine particle layers composed of n-type semiconductor fine particles are sequentially stacked in order only on a pattern portion of a surface of a substrate coated with a coating film composed of a first film compound having a first functional group and a first bonding group at respective two ends of the molecule in a direction from the coated substrate side toward a rear electrode side and in which up to y-th (y is an integer satisfying $y \geqq x+1$) semiconductor fine particle layers composed of p-type semiconductor fine particles are further sequentially stacked thereon in order includes step A of bringing a solution containing the first film compound into contact with a surface of a substrate so as to form bonds between the first bonding group and the surface of the substrate to thereby prepare a coated substrate in which the surface of the substrate is coated with a coating film composed of the first film compound; step B of performing a pattern forming process by irradiating the surface of the coated substrate with an energy beam through a mask that covers a pattern portion so as to allow the coating film composed of the first film compound to remain only on the pattern portion; step C of bringing a solution containing a second film compound having a second functional group and a second bonding group at respective two ends of the molecule into contact with surfaces of n-type semiconductor fine particles so as to form bonds between the second bonding group and the surfaces of the n-type semiconductor fine particles to thereby prepare coated n-type semiconductor fine particles in which surfaces of the n-type semiconductor fine particles are coated with a coating film composed of the second film compound; step D of bringing a solution containing the second film compound into contact with surfaces of p-type semiconductor fine particles so as to form bonds between the second bonding group and the surfaces of the p-type semiconductor fine particles to thereby prepare coated p-type semiconductor fine particles in which the surfaces of the p-type semiconductor fine particles are coated with a coating film composed of the second film compound; step E of bringing a first coupling agent having at least one first coupling reactive group that forms a bond by coupling reaction with the first functional group and at least one second coupling reactive group that forms a bond by coupling reaction with the second functional group into contact with the coated surface of the coated substrate so as to prepare a reactive substrate having a coating film of the first coupling agent; step F of bringing a solution containing a third film compound containing a third functional group and a third bonding group at respective two ends of the molecule into contact with surfaces of n-type semiconductor fine particles so as to form bonds between the third bonding group and the surfaces of the n-type semiconductor fine particles and then bringing a second coupling agent having at least one second coupling reactive group that forms a bond by coupling reaction with the second functional group and at least one third coupling reactive group that forms a bond by coupling reaction with the third functional group into contact with the surfaces of the n-type semiconductor fine particles so as to prepare reactive n-type semiconductor fine particles having surfaces with a coating film composed of the second coupling agent, the coating film being fixed via bonds formed by coupling reaction between the third functional group and the third coupling reactive group; step G of bringing a solution containing a fourth film compound having a fourth functional group and a fourth bonding group at respective two ends of the molecule into contact with surfaces of p-type semiconductor fine particles so as to form bonds between the fourth bonding group and the surfaces of the p-type semiconductor fine particles and then bringing a third coupling agent having at least one second coupling reactive group that forms a bond by coupling reaction with the second functional group and at least one fourth coupling reactive group that forms a bond by coupling reaction with the fourth functional group into contact with the surfaces of the p-type semiconductor fine particles so as to prepare reactive p-type semiconductor fine particles having surfaces with a coating film composed of the third coupling agent, the coating film being fixed via bonds formed by coupling reaction between the fourth functional group and the fourth coupling reactive group; step H of alternately stacking the coated n-type semiconductor fine particles and the reactive n-type semiconductor fine particles on a surface of the reactive substrate and fixing them through coupling reaction between the second functional group and the second coupling reactive group so as to form first to x-th semiconductor fine particle layers composed of n-type semiconductor fine particles; step I of alternately stacking the reactive p-type semiconductor fine particles and the coated p-type semiconductor particles on the fine particle layer of the coated n-type semiconductor fine particle located on the top of the semiconductor fine particle films formed in step H and fixing them through coupling reaction between the second functional group and the second coupling reactive group so as to form (x+1)-th to y-th semiconductor fine particle layers composed of p-type semiconductor fine particles that are sequentially stacked in order; and step J of forming a rear electrode on the top of the semiconductor fine particle films formed in step I.

In the methods for making the optical sensor of the fourth and fifth inventions, the first to fourth film compounds are preferably the same compound and the first to third coupling agents are preferably the same compound since production costs for solar batteries can be reduced.

In steps A, C, D, F, and G described above, the first to fourth film compounds that remain unreacted are preferably removed by washing and all of the coating films of the first to fourth film compounds are preferably monomolecular films since the internal resistance of the optical sensor can be reduced without damaging the properties of the silicon fine particles.

According to a sixth invention, a method for making an optical sensor in which first to x-th (X is an even integer of 2 or more) semiconductor fine particle layers composed of n-type semiconductor fine particles are sequentially stacked in order only on a pattern portion of a surface of a substrate coated with a coating film composed of a first film compound having a first functional group and a first bonding group at respective two ends of the molecule in a direction from the coated substrate side toward a rear electrode side and in which up to y-th (y is an integer satisfying y≧x+1) semiconductor fine particle layers composed of p-type semiconductor fine particles are further sequentially stacked thereon in order includes step A of bringing a solution containing the first film compound into contact with a surface of a substrate so as to form bonds between the first bonding group and the surface of the substrate to thereby prepare a coated substrate in which the surface of the substrate is coated with a coating film composed of the first film compound; step B of performing a pattern forming process by irradiating the surface of the coated substrate with an energy beam through a mask that covers a pattern portion so as to allow the coating film composed of the first film compound to remain only on the pattern portion; step C of bringing a solution containing the first film compound into contact with surfaces of n-type semiconductor fine particles so as to form bonds between the first bonding group and the surfaces of the n-type semiconductor fine particles to thereby prepare coated n-type semiconductor fine particles in which the surfaces of the n-type semiconductor fine particles are coated with a coating film composed of the first film compound; step D of bringing a solution containing the first film compound into contact with surfaces of p-type semiconductor fine particles so as to form bonds between the first bonding group and the surfaces of the p-type semiconductor fine particles to thereby prepare coated p-type semiconductor fine particles in which the surfaces of the p-type semiconductor fine particles are coated with a coating film composed of the first film compound; step F of bringing a solution containing a second film compound having a second functional group and a second bonding group at respective two ends of the molecule into contact with surfaces of n-type semiconductor fine particles so as to form bonds between the second bonding group and the surfaces of the n-type semiconductor fine particles and then bringing a first coupling agent having at least one first coupling reactive group that forms a bond by coupling reaction with the first functional group and at least one second coupling reactive group that forms a bond by coupling reaction with the second functional group into contact with the surfaces of the n-type semiconductor fine particles so as to prepare reactive n-type semiconductor fine particles having surfaces with a coating film composed of the first coupling agent, the coating film being fixed via bonds formed by coupling reaction between the second functional group and the second coupling reactive group; step G of bringing a solution containing a third film compound having a third functional group and a third bonding group at respective two ends of the molecule into contact with surfaces of p-type semiconductor fine particles so as to form bonds between the third bonding group and the surfaces of the p-type semiconductor fine particles and then bringing a second coupling agent having at least one first coupling reactive group that forms a bond by coupling reaction with the first functional group and at least one third coupling reactive group that forms a bond by coupling reaction with the third functional group into contact with the surfaces of the p-type semiconductor fine particles so as to prepare reactive p-type semiconductor fine particles having surfaces with a coating film composed of the second coupling agent, the coating film being fixed via bonds formed by coupling reaction between the third functional group and the third coupling reactive group; step H of alternately stacking the reactive n-type semiconductor fine particles and the coated n-type semiconductor fine particles on a surface of the reactive substrate and fixing them through coupling reaction between the first functional group and the first coupling reactive group so as to form first to x-th semiconductor fine particle layers composed of n-type semiconductor fine particles that are sequentially stacked in order; step I of alternately stacking the reactive p-type semiconductor fine particles and the coated p-type semiconductor particles on the fine particle layer of the coated n-type semiconductor fine particle located on the top of the semiconductor fine particle films formed in step H and fixing them through coupling reaction between the first functional group and the first coupling reactive group so as to form (x+1)-th to y-th semiconductor fine particle layers composed of p-type semiconductor fine particles that are sequentially stacked in order; and step J of forming a rear electrode on the top of the semiconductor fine particle films formed in step I.

According to a seventh invention, a method for making an optical sensor in which first to x-th (X is an odd integer of 1 or more) semiconductor fine particle layers composed of n-type semiconductor fine particles are sequentially stacked in order only on a pattern portion of a surface of a substrate coated with a coating film composed of a first film compound having a first functional group in a direction from the coated substrate side toward a rear electrode side and in which up to y-th (y is an integer satisfying y≧x+1) semiconductor fine particle layers composed of p-type semiconductor fine particles are further sequentially stacked thereon in order includes step A of bringing a solution containing the first film compound into contact with a surface of a substrate so as to form bonds between the first bonding group and the surface of the substrate to thereby prepare a coated substrate in which the surface of the substrate is coated with a coating film composed of the first film compound; step B of performing a pattern forming process by irradiating the surface of the coated substrate with an energy beam through a mask that covers a pattern portion so as to allow the coating film composed of the first film compound to remain only on the pattern portion; step C of bringing a solution containing the first film compound into contact with surfaces of n-type semiconductor fine particles so as to form bonds between the first bonding group and the surfaces of the n-type semiconductor fine particles to thereby prepare coated n-type semiconductor fine particles in which the surfaces of the n-type semiconductor fine particles are coated with a coating film composed of the first film compound; step D of bringing a solution containing the first film compound into contact with surfaces of p-type semiconductor fine particles so as to form bonds between the first bonding group and the surfaces of the p-type semiconductor fine particles to thereby prepare coated p-type semiconductor fine particles in which the surfaces of the p-type semiconductor fine particles are coated with a coating film composed of the first film compound; step F of bringing a solution containing a second film compound containing a second functional group and a second bonding group at two ends of the molecule, respectively, into contact with surfaces of n-type semiconductor fine particles so as to form bonds between the second bonding group and the surfaces of the n-type semiconductor fine particles and then bringing a first coupling agent having at least one first coupling reactive group that forms a bond by coupling reaction with the first functional group and at least one second coupling reactive group that forms a bond by coupling reaction with the second functional group into contact with the surfaces of the n-type semiconductor fine particles so as to prepare reactive n-type semiconductor fine particles having surfaces with a coating film composed of the first coupling agent, the coating film being fixed via bonds formed by coupling reaction between the second functional group and the second coupling reactive group; step G of bringing a solution containing a third film compound having a third functional group and a third bonding group at respective two ends of the molecule into contact with surfaces of p-type semiconductor fine particles so as to form bonds between the third bonding group and the surfaces of the p-type semiconductor fine particles and then bringing a second coupling agent having at least one first coupling reactive group that forms a bond by coupling reaction with the first functional group and at least one third coupling reactive group that forms a bond by coupling reaction with the third functional group into contact with the surfaces of the p-type semiconductor fine particles so as to prepare reactive p-type semiconductor fine particles having surfaces with a coating film composed of the second coupling agent, the coating film being fixed via bonds formed by coupling reaction between the third functional group and the third coupling reactive group; step H of alternately stacking the reactive n-type semiconductor fine particles and the coated n-type semiconductor fine particles on a surface of the reactive substrate and fixing them through coupling reaction between the first functional group and the first coupling reactive group so as to form first to x-th semiconductor fine particle layers composed of n-type semiconductor fine particles that are sequentially stacked in order; step I of alternately stacking the coated p-type semiconductor fine particles and the reactive p-type semiconductor particles on the fine particle layer of the reactive n-type semiconductor fine particles located on the top of the semiconductor fine particle films formed in step H and fixing them through coupling reaction between the first functional group and the first coupling reactive group so as to form (x+1)-th to y-th semiconductor fine particle layers composed of p-type semiconductor fine particles that are sequentially stacked in order; and step J of forming a rear electrode on the top of the semiconductor fine particle films formed in step I.

In the methods for making the optical sensor of the sixth and seventh inventions, the first to third film compounds are preferably the same compound and the first and second coupling agents are preferably the same compound since production costs for solar batteries can be reduced.

In steps A, C, D, F, and G described above, the first to third film compounds that remain unreacted are preferably removed by washing and all of the coating films of the first to third film compounds are preferably monomolecular films since the internal resistance of the optical sensor can be reduced without damaging the properties of the silicon fine particles.

In the methods for making the optical sensor according to the third, sixth, and seventh inventions, the first and second film compounds are preferably alkoxysilane compounds and each of the solutions containing, respectively, the first and second film compounds preferably further contain, as a condensation catalyst, at least one compound selected from the group consisting of a carboxylic acid metal salt, a carboxylate metal salt, a carboxylic acid metal salt polymer, a carboxylic acid metal salt chelate, a titanate, and a titanate chelate.

Alternatively, the first to third film compounds may be alkoxysilane compounds, and each of the solutions containing, respectively, the first to third film compounds may further contain, as a condensation catalyst, at least one compound selected from the group consisting of a ketimine compound, an organic acid, an aldimine compound, an enamine compound, an oxazolidine compound, and an aminoalkylalkoxysilane compound.

In the methods for making the optical sensor according to the fourth and fifth inventions, the first to fourth film compounds may be alkoxysilane compounds and each of the solutions containing, respectively, the first to fourth film compounds may further contain, as a condensation catalyst, at least one compound selected from the group consisting of a carboxylic acid metal salt, a carboxylate metal salt, a carboxylic acid metal salt polymer, a carboxylic acid metal salt chelate, a titanate, and a titanate chelate.

Alternatively, the first to third film compounds may be alkoxysilane compounds, and the solutions containing the first to third film compounds may each further contain, as a condensation catalyst, at least one compound selected from the group consisting of a ketimine compound, an organic acid, an aldimine compound, an enamine compound, an oxazolidine compound, and an aminoalkylalkoxysilane compound.

In these cases, at least one compound selected from the group consisting of a ketimine compound, an organic acid, an aldimine compound, an enamine compound, an oxazolidine compound, and an aminoalkylalkoxysilane compound is preferably further contained as a promoter.

In the methods for making the optical sensors of the third to seventh inventions, the bonds formed by the coupling reaction may be N—$CH_2CH(OH)$ bonds formed by reaction of amino or imino groups with epoxy groups.

Alternatively, the bonds formed by the coupling reaction may be NH—CONH bonds formed by reaction of amino or imino groups with isocyanate groups.

Effect of the Invention

The optical sensors described in claims 1 to 10 and the methods for making the optical sensors described in claims 11 to 32 are particularly advantageous in that: an optical semiconductor fine particle layer sensor with a particle-size-level uniform thickness, in which layers of n- and p-type semiconductor fine particles are formed one by one on an any desired pattern on a surface of an any desired substrate; a stacked type semiconductor fine particle layer optical sensor having multiply-stacked films each of which is composed of a layer of n- or p-type semiconductor fine particles; and the production method thereof, can be provided by using the semiconductor fine particles without damaging the original functions of the semiconductor particles at a low cost.

Since one layer of semiconductor fine particles is fixed and bonded on the surface of the substrate, the peel strength of the optical sensor can be enhanced.

Since semiconductor fine particle films are stacked and fixed one by one via bonds formed by coupling reaction, the thickness of the fine particle films can be easily controlled.

BEST MODES FOR CARRYING OUT THE INVENTION

The embodiments of the present invention will now be described with reference to the attached drawings to enhance the understanding of the present invention.

Figure 1:
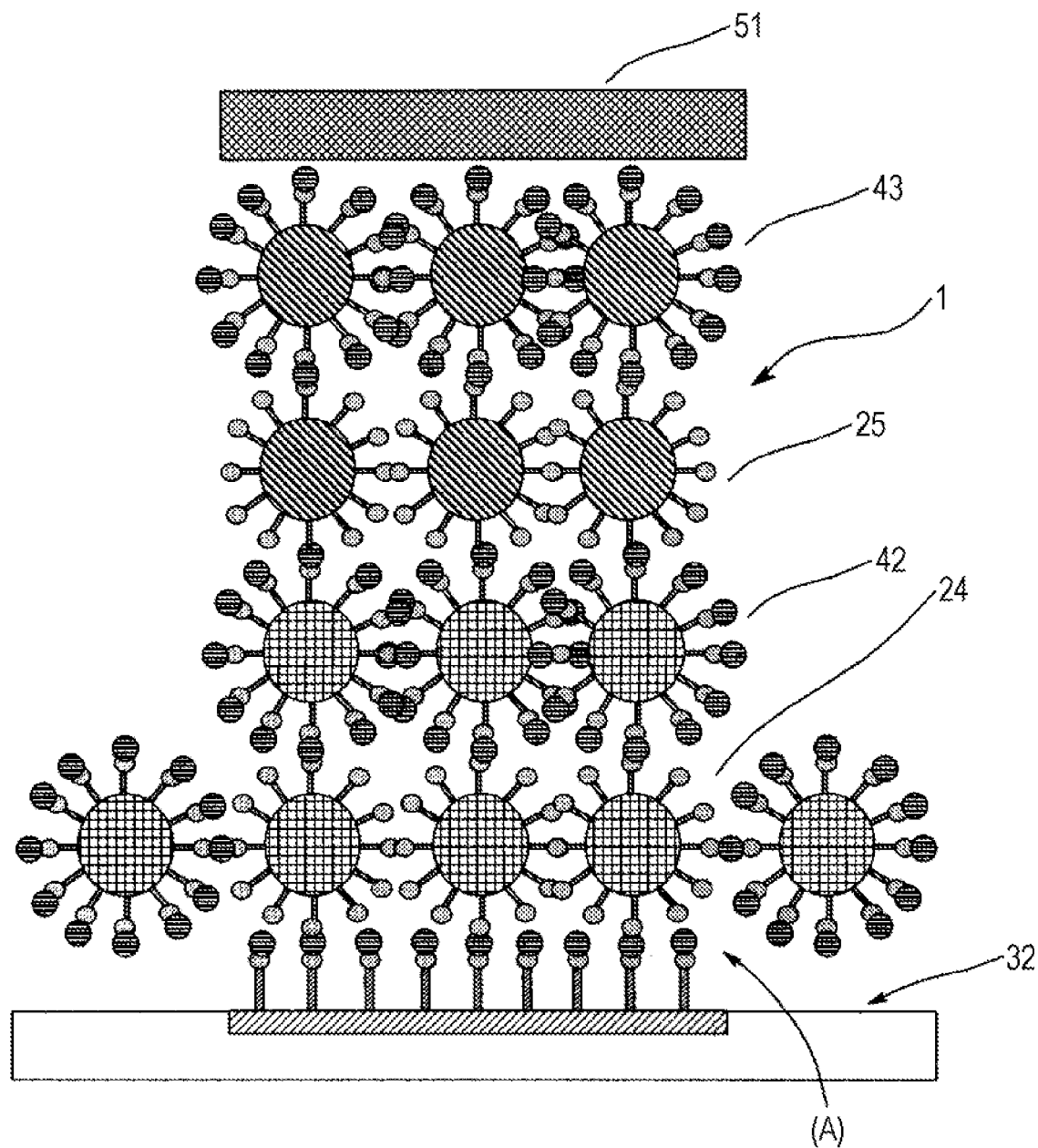
FIG. 1 A diagram illustrating a cross-sectional structure of an optical sensor according to a first embodiment of the present invention.
Figure 1:
Figure 2:
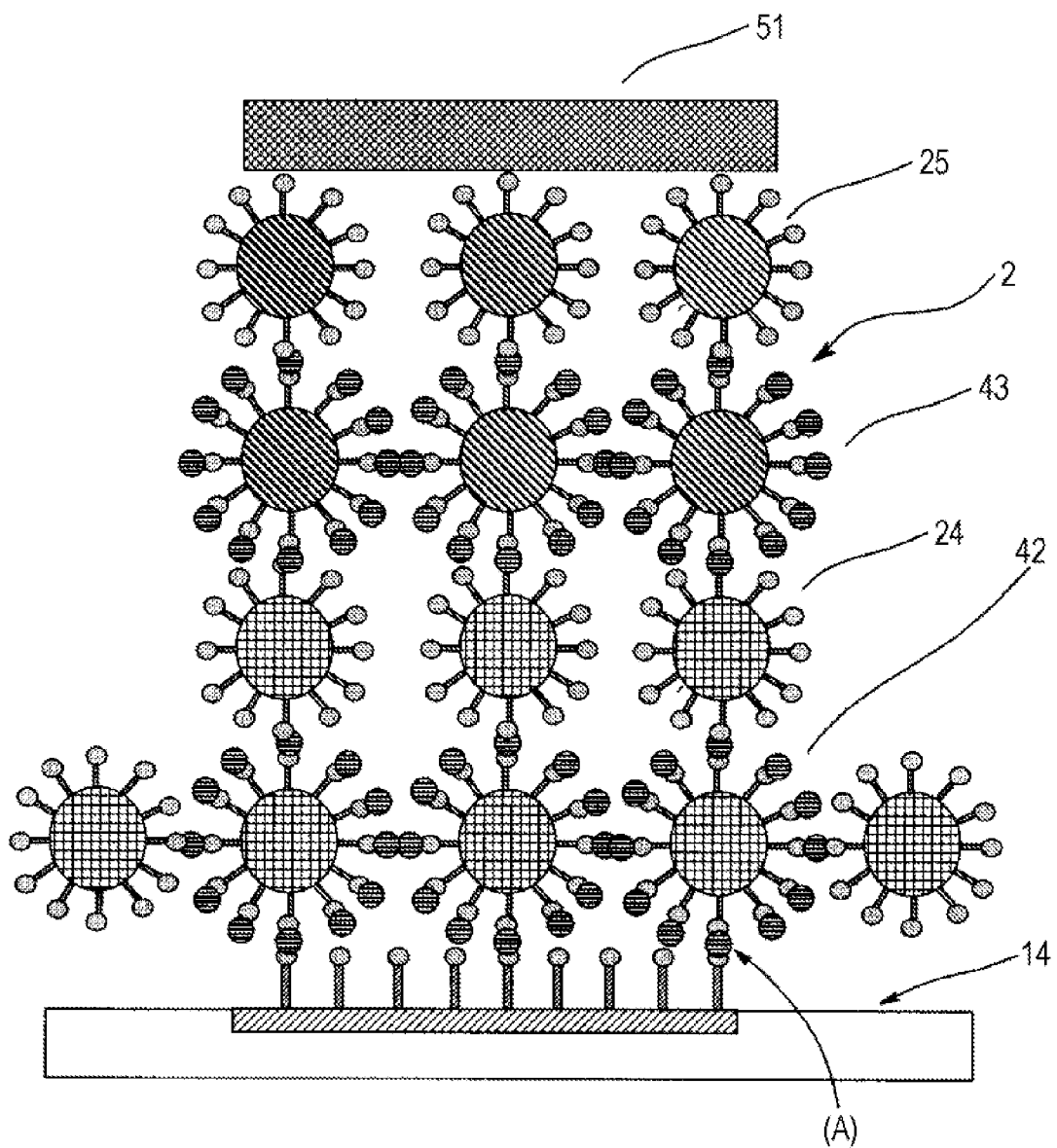
FIG. 2 A diagram illustrating a cross-sectional structure of an optical sensor according to a second embodiment of the present invention.
Figure 2:
Figure 3:
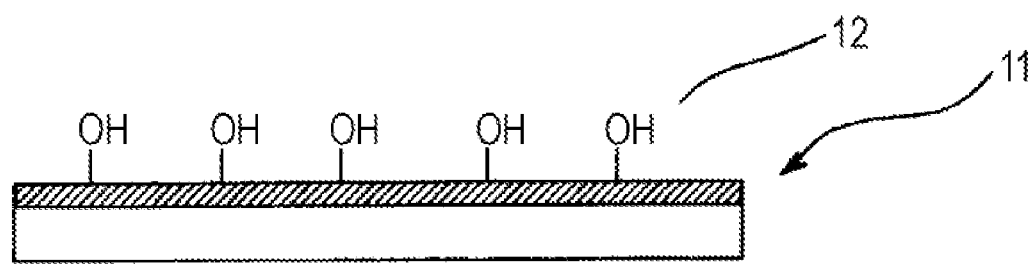
FIG. 3 Schematic views enlarged to a molecular level for explaining the process of making an epoxidized ITO glass plate in a method for making an optical sensor according to one embodiment of the present invention, (A) showing a cross-sectional structure of an ITO glass plate before reaction and (B) showing a cross-sectional structure of an ITO glass plate on which a monomolecular film of a film compound having an epoxy group is formed.
Figure 3:
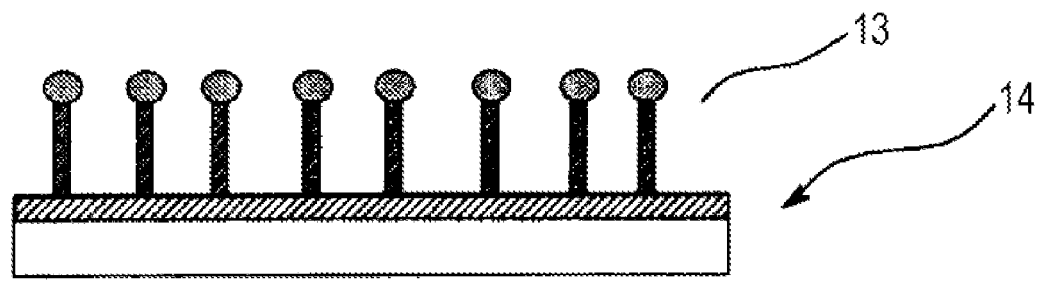
Figure 3:
Figure 5:
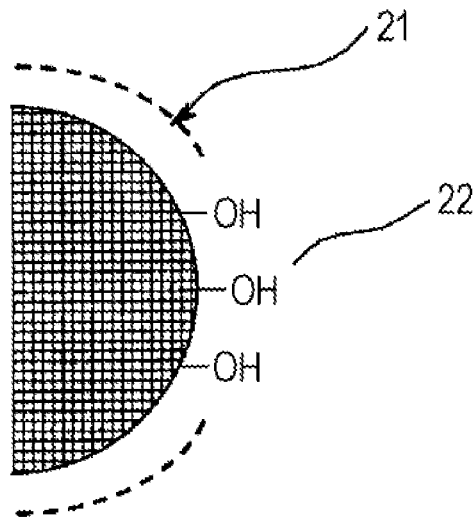
FIG. 5 Schematic views enlarged to a molecular level for explaining the process of making an epoxidized n-type silicon fine particles in the method for making the optical sensor, (A) showing a cross-sectional structure of an n-type silicon fine particle before reaction and (B) showing a cross-sectional structure of an n-type silicon fine particle with a monomolecular film of a film compound having an epoxy group.
Figure 5:
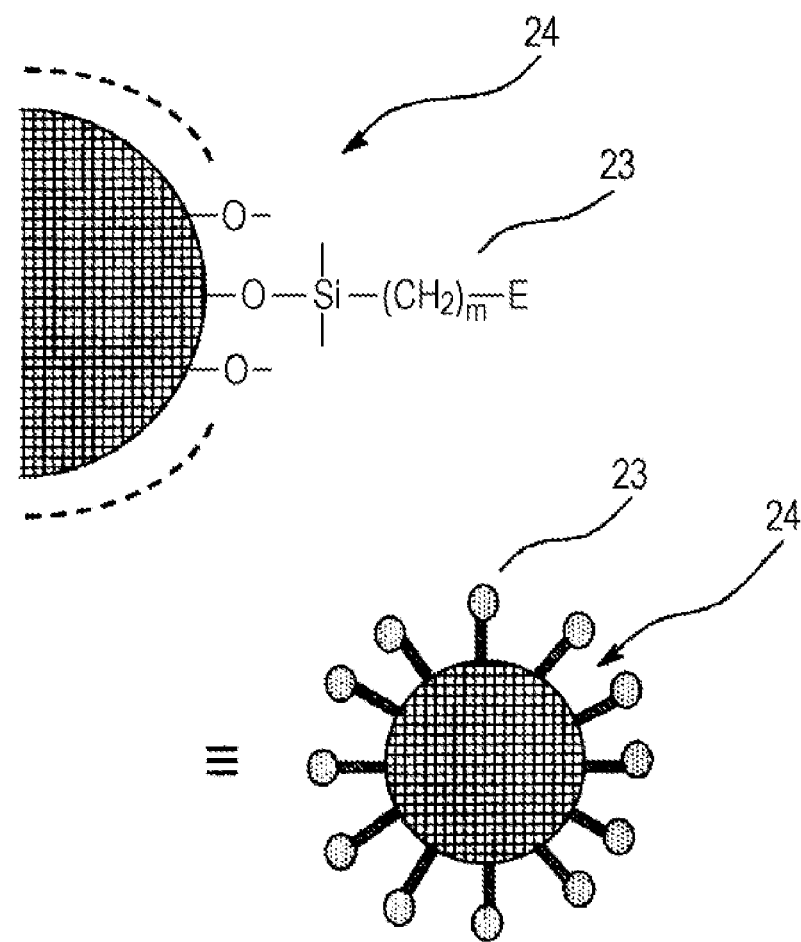
Figure 6:
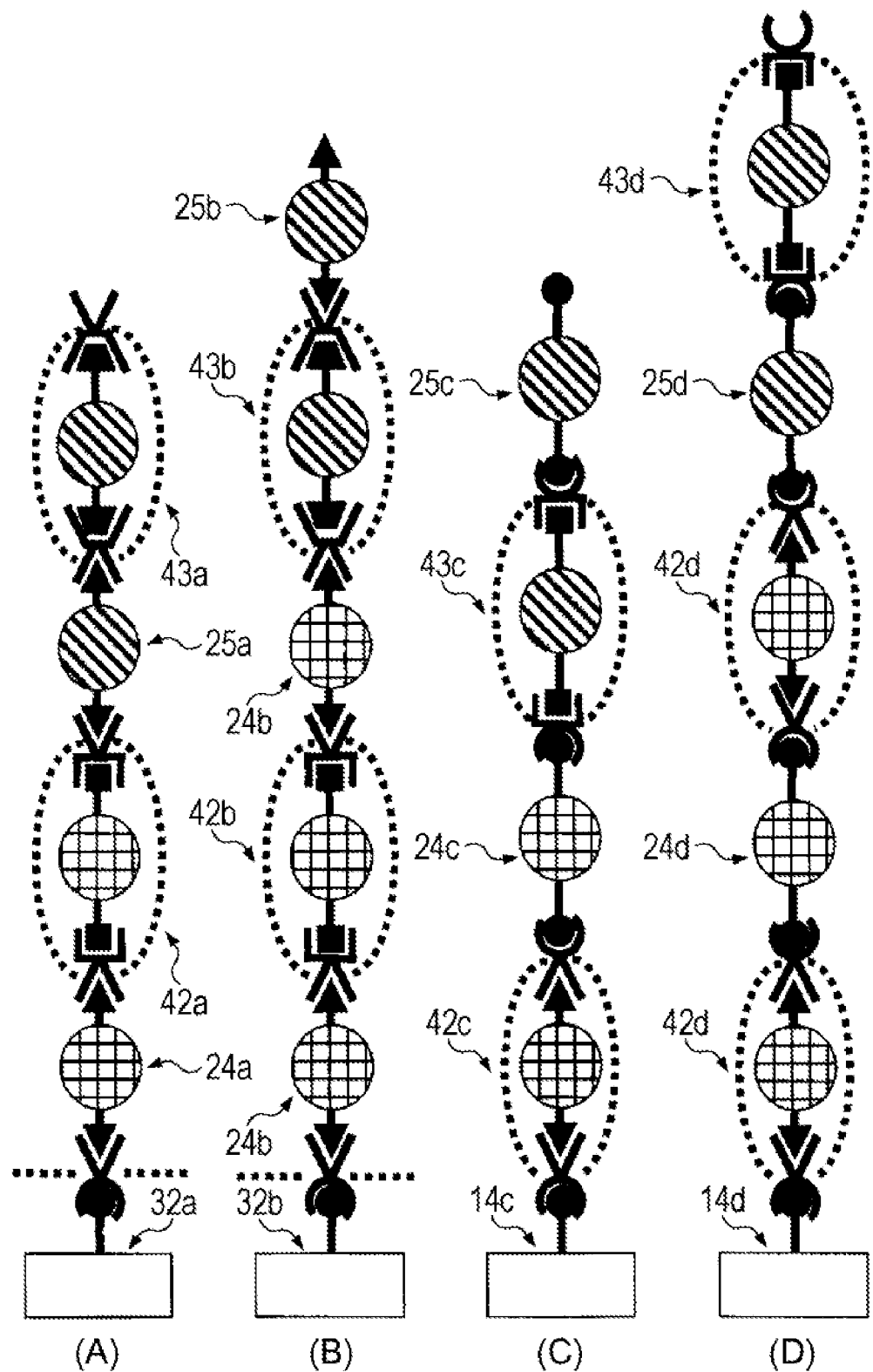
FIG. 6 A schematic diagram for explaining combinations of film compounds and coupling agents used in making the optical sensor.

FIG. 1 is a diagram illustrating a cross-sectional structure of an optical sensor according to a first embodiment of the present invention. FIG. 2 is a diagram illustrating a cross-sectional structure of an optical sensor according to a second embodiment of the present invention. FIG. 3 includes schematic views enlarged to a molecular level for explaining the process of making an epoxidized ITO glass plate in a method for making an optical sensor according to one embodiment of the present invention, FIG. 3(A) showing a cross-sectional structure of an ITO glass plate before reaction and FIG. 3(B) showing a cross-sectional structure of an ITO glass plate on which a monomolecular film of a film compound having an epoxy group is formed. FIG. 4(A) is a schematic view enlarged to a molecular level for explaining a pattern forming process in the method for making the optical sensor and FIG. 4(B) is a schematic view enlarged to a molecular level for explaining a pattern forming process according to a modified embodiment. FIG. 5 includes schematic views enlarged to a molecular level for explaining the process of making an epoxidized n-type silicon fine particles in the method for making the optical sensor, FIG. 5(A) showing a cross-sectional structure of an n-type silicon fine particle before reaction and FIG. 5(B) showing a cross-sectional structure of an n-type silicon fine particle with a monomolecular film of a film compound having an epoxy group. FIG. 6 us a schematic diagram for explaining combinations of film compounds and coupling agents used in making the optical sensor.

Next, an optical sensor 1 according to a first embodiment of the present invention is described.

As shown in FIG. 1, in the optical sensor 1, a fine particle layer composed of epoxidized n-type silicon fine particles (one example of coated n-type semiconductor fine particles) 24 that are aligned is fixed on a surface of a reactive ITO glass plate (one example of a reactive substrate) 32 by bonding, and a layer of reactive n-type silicon fine particles 42 (one example of reactive n-type semiconductor fine particles) is fixed thereon by bonding.

A layer of epoxidized p-type silicon fine particles (one example of coated p-type semiconductor fine particles) 25 and a layer of reactive p-type silicon fine particles (one example of reactive p-type semiconductor fine particles) 43 are fixed on the reactive n-type silicon fine particles 42 by bonding.

The surface of the reactive ITO glass plate 32 is coated with a monomolecular film 13 composed of a film compound having a epoxy group (one example of a first film compound), and the surface of the monomolecular film 13 is coated with a 2-methylimidazole coating film fixed via bonds formed by coupling reaction of amino groups (one example of a first coupling reactive group) of 2-methylimidazole with epoxy groups (indicated as (A) in FIG. 1).

The surfaces of the reactive n-type silicon fine particles 42 that form the second fine particle layer is further coated with a 2-methylimidazole coating film fixed via bonds formed by coupling reaction of amino groups (one example of a third coupling reactive group) of 2-methylimidazole (one example of a third coupling agent) with epoxy groups.

The reactive ITO glass plate 32 and the epoxidized n-type silicon fine particles 24, the epoxidized n-type silicon fine particles 24 and the reactive n-type silicon fine particles 42, the reactive n-type silicon fine particles 42 and the epoxidized p-type silicon fine particles 25, and the epoxidized p-type silicon fine particles 25 and the reactive p-type silicon fine particles 43 are fixed and bonded between each other via bonds formed by coupling reaction of epoxy groups and amino or imino groups of 2-methylimidazole.

Note that as shown in FIG. 1, the reactive n-type silicon fine particles 42 can bond to lateral side faces of the epoxidized n-type silicon fine particles in the first layer; however, this rarely impairs the shape of the actual pattern. For the sake of description, the size of the fine particles depicted in FIG. 1 is enlarged relative to the actual size of the pattern.

As shown in FIGS. 3(A), 3(B), 4(A), and 5(A), (B), a method for making the optical sensor 1 includes step A (see FIG. 3) of bringing a solution containing an alkoxysilane compound having an epoxy group (one example of the first film compound) into contact with a surface of an ITO glass plate (an example of the substrate) 11 so as to form bonds between the alkoxysilyl groups (one example of first bonding groups) and hydroxyl groups 12 of the surface of the ITO glass plate 11 and to thereby prepare an epoxidized ITO glass plate 14 (one example of the coated substrate); step B (see FIG. 4(A)) of performing a pattern forming process by irradiating the surface of the epoxidized ITO glass plate 14 with light through a mask 61 that covers a pattern portion (one example of energy irradiation) so as to form a patterned epoxidized ITO glass plate 62 in which epoxy groups remain only on the pattern portion; step C (see FIG. 5) of bringing an alkoxysilane compound having an epoxy group (one example of the second film compound) into contact with surfaces of n-type silicon fine particles (one example of n-type semiconductor fine particles) 21 so as to form bonds between the alkoxysilyl groups (one example of second bonding groups) and hydroxyl groups 22 of the surfaces of the n-type silicon fine particles 21 to thereby prepare epoxidized n-type silicon fine particles 24; step D (see FIG. 5) of bringing an alkoxysilane compound having an epoxy group (one example of the second film compound) into contact with surfaces of p-type silicon fine particles (one example of p-type semiconductor fine particles) so as to form bonds between the alkoxysilyl groups (one example of the second bonding groups) and the hydroxyl groups of the surfaces of the p-type silicon fine particles to thereby prepare epoxidized p-type silicon fine particles 25; step E of bringing 2-methylimidazole into contact with the surface of the patterned epoxidized ITO glass plate 22 to cause coupling reaction between the epoxy groups and the amino groups to thereby prepare a reactive ITO glass plate 32; step F of bringing 2-methylimidazole into contact with surfaces of the epoxidized n-type silicon fine particles 24 to cause coupling reaction between the epoxy groups and the amino groups to thereby prepare reactive n-type silicon fine particles 42; step G of bringing 2-methylimidazole into contact with surfaces of the epoxidized p-type silicon fine particles 25 to cause coupling reaction between the epoxy groups and the amino groups to thereby prepare reactive p-type silicon fine particles 43; step H of alternately bringing the epoxidized n-type silicon fine particles 24 and the reactive n-type silicon fine particles 42 into contact with the surface of the reactive ITO glass plate 32 so as to form bonds by coupling reaction between the epoxy groups and the imino groups (one example of second coupling reactive groups) to thereby fix the epoxidized n-type silicon fine particles 24 and the reactive n-type silicon fine particles 42 on the reactive ITO glass plate 32; step I of alternately bringing the epoxidized p-type silicon fine particles 25 and the reactive p-type silicon fine particles 43 into contact thereon so as to form bonds by coupling reaction between the epoxy groups and the imino groups (one example of second coupling reactive groups) to thereby fix the epoxidized p-type silicon fine particles 25 and the reactive p-type silicon fine particles 43; and step J of forming a transparent electrode 51 at the top.

Steps A to J will now be described in further detail.

In step A (FIG. 3), a film compound having an epoxy group is brought into contact with the ITO glass plate 11 to prepare an epoxidized ITO glass plate 14 having a surface coated with the monomolecular film 13 of the film compound having an epoxy group.

There is no specific limitation as to the size of the ITO glass plate 11.

Any desired compound that adsorbs or bonds on the surface of the ITO glass plate 11 and that can form a monomolecular film by self assembly can be used as the film having an epoxy group compound. An alkoxysilane compound represented by the general formula (Chem. 1) below that has a functional group comprising an epoxy group (oxirane ring) at one end of a straight-chain alkylene group and an alkoxysilyl group (one example of the first bonding group) at the other end is preferred as the film compound having an epoxy group:

[Chem. 1]

In the above formula, the functional group E represents a functional group that comprise an epoxy group, m represents an integer of 3 to 20, and R represents a $C_1$-$C_4$ alkyl group.

Specific examples of the film compounds having an epoxy group that can be employed are alkoxysilane compounds indicated in items (1) to (12) below:

(1) $(CH_2OCH)CH_2O(CH_2)_3Si(OCH_3)_3$
(2) $(CH_2OCH)CH_2O(CH_2)_7Si(OCH_3)_3$
(3) $(CH_2OCH)CH_2O(CH_2)_{11}Si(OCH_3)_3$
(4) $(CH_2CHOCH(CH_2)_2)CH(CH_2)_2Si(OCH_3)_3$
(5) $(CH_2CHOCH(CH_2)_2)CH(CH_2)_4Si(OCH_3)_3$
(6) $(CH_2CHOCH(CH_2)_2)CH(CH_2)_6Si(OCH_3)_3$
(7) $(CH_2OCH)CH_2O(CH_2)_3Si(OC_2H_5)_3$
(8) $(CH_2OCH)CH_2O(CH_2)_7Si(OC_2H_5)_3$
(9) $(CH_2OCH)CH_2O(CH_2)_{11}Si(OC_2H_5)_3$
(10) $(CH_2CHOCH(CH_2)_2)CH(CH_2)_2Si(OC_2H_5)_3$
(11) $(CH_2CHOCH(CH_2)_2)CH(CH_2)_4Si(OC_2H_5)_3$
(12) $(CH_2CHOCH(CH_2)_2)CH(CH_2)_6Si(OC_2H_5)_3$

Here, the $(CH_2OCH)CH_2O$— group represents a functional group (glycidyl group) represented by Chem. 2 and the $(CH_2CHOCH(CH_2)_2)CH$— group represents a functional group (3,4-epoxycyclohexyl group) represented by Chem. 3:

[Chem. 2]

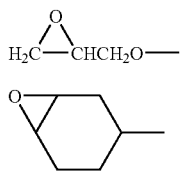

[Chem. 3]

The epoxidized ITO glass plate 14 can be made by applying, on the surface of the ITO glass plate 11, a reaction solution containing an alkoxysilane compound having epoxy and alkoxysilyl (one example of the second bonding groups) groups, a condensation catalyst for accelerating condensation reaction between the alkoxysilyl groups and the hydroxyl groups 12 on the surface of the ITO glass plate 11, and a nonaqueous organic solvent, and conducting reaction in air at room temperature. The application can be carried out by a desired process, such as a doctor blade process, a dip coating process, a spin coating process, a spraying process, or a screen-printing process.

Examples of the condensation catalysts that can be used include metal salts such as carboxylic acid metal salts, carboxylate metal salts, carboxylic acid metal salt polymers, carboxylic acid metal salt chelates, titanates, and titanate chelates.

The amount of condensation catalyst added is preferably 0.2 to 5 mass % and more preferably 0.5 to 1 mass % of the alkoxysilane compound.

Specific examples of the carboxylic acid metal salts include stannous acetate, dibutyltin dilaurate, dibutyltin dioctate, dibutyltin diacetate, dioctyltin dilaurate, dioctyltin dioctate, dioctyltin diacetate, stannous dioctanoate, lead naphthenate, cobalt naphthenate, and iron 2-ethylhexenoate.

Specific examples of the carboxylate metal salts include dioctyltin bisoctylthioglycolate and dioctyltin maleate.

Specific examples of the carboxylic acid metal salt polymer include dibutyltin maleate polymers and dimethyltin mercaptopropionate polymers.

Specific examples of the carboxylic acid metal salt chelates include dibutyltin bisacetylacetate and dioctyltin bisacetyl-laurate.

Specific examples of the titanates include tetrabutyl titanate and tetranonyl titanate.

Specific examples of the titanate chelates include bis(acetylacetonyl)di-propyltitanate.

Condensation reaction between the hydroxyl groups 12 of the surface of the ITO glass plate 11 and the alkoxysilyl groups produces the monomolecular film 13 of a film compound having an epoxy group with a structure represented by Chem. 4 below. Note that the three single bonds extending from the oxygen atoms are bonded to silicon (Si) atoms on the surface of the ITO glass plate 11 or of adjacent silane compounds, and at least one of the three bonds is bonded to a silicon atom of the surface of the ITO glass plate 11.

[Chem. 4]

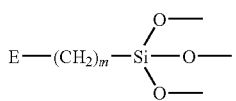

Since the alkoxysilyl groups decompose in the presence of moisture, the reaction is preferably conducted in air at a relative humidity of 45% or less. Since the condensation reaction is inhibited by moisture, oil, and fat adhering on the surface of the ITO glass plate 11, the ITO glass plate 11 is preferably thoroughly washed and dried to remove these impurities in advance.

In the case where one of the metal salts described above is used as the condensation catalyst, the time taken to complete the condensation reaction is about 2 hours.

The reaction time can be reduced to about ½ to ⅔ by using at least one compound selected from the group consisting of a ketimine compound, an organic acid, an aldimine compound, an enamine compound, an oxazolidine compound, and an aminoalkylalkoxysilane compound as the condensation catalyst instead of the metal salt described above.

Alternatively, these compounds may be used as promoters in a mixture with the metal salts described above (the mixing ratio can be 1:9 to 9:1 on a mass basis and the ratio is preferably about 1:1) to further shorten the reaction time.

For example, in the case where the epoxidized n-type silicon fine particles 21 are made by using a ketimine compound, namely, H3 produced by Japan Epoxy Resins Co., Ltd., as the condensation catalyst instead of dibutyltin oxide without changing other conditions, the reaction time can be shortened to about 1 hour without degrading the quality of the epoxidized n-type silicon fine particles 21.

In the case where the epoxidized n-type silicon fine particles 21 are made by employing a mixture of dibutyltin bisacetylacetonate and H3 produced by Japan Epoxy Resins Co., Ltd. (1:1 mixing ratio) as the condensation catalyst without changing other conditions, the reaction time can be shorted to about 20 minutes.

The ketimine compound that can be used here is not particularly limited. Examples of the ketimine compound include 2,5,8-triaza-1,8-nonadiene, 3,11-dimethyl-4,7,10-triaza-3,10-tridecadiene, 2,10-dimethyl-3,6,9-triaza-2,9-undecadiene, 2,4,12,14-tetramethyl-5,8,11-triaza-4,11-pentadecadiene, 2,4,15,17-tetramethyl-5,8,11,14-tetraaza-4,14-octadecadiene, 2,4,20,22-tetramethyl-5,12,19-triaza-4,19-trieicosadiene.

The organic acid that can be used is also not particularly limited. Examples of the organic acid include formic acid, acetic acid, propionic acid, butyric acid, and malonic acid.

In making the reaction solution, an organic chlorine-based solvent, a hydrocarbon-based solvent, a fluorocarbon-based solvent, a silicone-based solvent, or a mixture thereof can be used. In order to prevent hydrolysis of the alkoxysilane compound, it is preferable to remove moisture from the solvent in advance by using a drying agent or by distillation. The boiling point of the solvent is preferably from 50° C. to 250° C.

Specific examples of the usable solvent include nonaqueous petroleum naphtha, solvent naphtha, petroleum ethers, petroleum benzin, isoparaffin, normal paraffin, decalin, industrial gasoline, nonane, decane, heating oil, dimethyl silicone, phenyl silicone, alkyl-modified silicone, polyether silicone, and dimethylformamide.

Alcohol solvents such as methanol, ethanol, and propanol, or mixtures of these can also be used.

Examples of the usable fluorocarbon solvent include chlorofluorocarbon solvents, Fluorinert (produced by 3M US), and Aflude (produced by Asahi Glass Co., Ltd.). These solvents may be used alone or in combination of two or more if they are highly miscible with each other. An organochlorine solvent such as dichloromethane, chloroform, or the like may also be added.

The preferred concentration of the alkoxysilane compound in the reaction solution is from 0.5 to 3 mass %.

After the reaction, the condensation catalyst and the excess alkoxysilane compound, remaining on the surface as unreacted material are removed to obtain the epoxidized ITO glass plate 14 having the surface coated with the monomolecular film 13 of the film compound having an epoxy group. A schematic view of a cross-sectional structure of the epoxidized ITO glass plate 14 produced as such is shown in FIG. 2(B).

Any solvent that can dissolve the alkoxysilane compound can be used as the washing solvent; however, dichloromethane, chloroform, N-methylpyrrolidone, and the like that are inexpensive, have high solubility, and can be easily removed by air drying are preferred.

After the reaction, leaving the epoxidized ITO glass plate 14 in air without washing with a solvent causes part of the alkoxysilane compound remaining on the surface to hydrolyze by the moisture contained in air, and condensation reaction occurs between the silanol groups generated and the alkoxysilyl groups. As a result, a ultrathin polymer film composed of polysiloxane is formed on the surface of the epoxidized ITO glass plate 14. Since this polymer film contains epoxy groups although not necessarily fixed on the surface of the epoxidized ITO glass plate 14 via covalent bonds, the polymer film has reactivity comparable to that of the monomolecular film 13 of the film compound having an epoxy group for the epoxidized ITO glass plate 14. Thus, not performing washing does not adversely affect the manufacturing steps described below.

It should be noted that although an alkoxysilane compound having an epoxy group is used in this embodiment, an alkoxysilane compound represented by the general formula below (Chem. 5) and having an amino group at one end of a straight-chain alkylene group and an alkoxysilyl group at the other end may be used instead.

As the coupling agent that reacts with amino groups, a coupling agent that has glycidyl groups at both ends can be used.

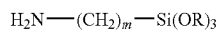

[Chem. 5]

$$H_2N-(CH_2)_m-Si(OR)_3$$

In the formula, m represents an integer of 3 to 20 and R represents a C1-C4 alkyl group.

Specific examples of the film compounds having an amino group that can be employed are alkoxysilane compounds indicated in items (21) to (28) below:
(21) $H_2N(CH_2)_3Si(OCH_3)_3$
(22) $H_2N(CH_2)_5Si(OCH_3)_3$
(23) $H_2N(CH_2)_7Si(OCH_3)_3$
(24) $H_2N(CH_2)_9Si(OCH_3)_3$
(25) $H_2N(CH_2)_5Si(OC_2H_5)_3$
(26) $H_2N(CH_2)_5Si(OC_2H_5)_3$
(27) $H_2N(CH_2)_7Si(OC_2H_5)_3$
(28) $H_2N(CH_2)_9Si(OC_2H_5)_3$ Among the condensation catalysts that can be used in the reaction solution, compounds containing tin (Sn) salts cannot be used as the condensation catalyst for the alkoxysilane compounds having an amino group since they react with the amino groups to generate precipitates.

Thus, in the case where the alkoxysilane compound having a amino group is used, the same compound as with the case of the alkoxysilane compound having an epoxy group other than the carboxylic acid tin salts, carboxylate tin salts, carboxylic acid tin salt polymers, and carboxylic acid tin salt chelates can be used as the condensation catalyst alone or in combination of two or more.

The type and combination of the promoters that can be used, type of the solvent, concentrations of the alkoxysilane compound, condensation catalyst, and promoter, reaction conditions, and reaction time are the same as with the case of the alkoxysilane compound having an epoxy group. The description therefor is thus omitted.

Although an ITO glass plate is used as the substrate in this embodiment, any desired substrate (e.g., printed substrate or silicon wafer) having a conductive layer containing active hydrogen groups such as hydroxyl groups or amino groups on its surface may be used instead.
(The Above is Related to Step A)

In step B, a pattern-forming process of exposing the surface of the epoxidized ITO glass plate 14 through the mask 61 that covers the pattern portion is carried out so as to prepare a patterned epoxidized ITO glass plate 62 (see FIG. 4) in which epoxy groups are selectively left in the pattern portion only.

As the mask used in exposure, a mask composed of any material that does not transmit light and remains undamaged by irradiation at least during the exposure, such as a material for reticles for photolithography in the production of semiconductor devices or the like can be used. The exposure may be proximity exposure or, if minute patterns are to be formed, reduced projection exposure.

A laser beam such as XeF (353 nm), XeCl (308 nm), KrF (248 nm), ArF (193 nm), or the like generated by an excimer laser or the like is preferred as the light source. As shown in FIG. 4(A), laser beam irradiation raises the temperature of the irradiated portion and the film compound having an epoxy group that covers the irradiated portion is removed (indicated by 63 in FIG. 4(A)) thereby. As a result, a patterned epoxidized ITO glass plate 22 is obtained (see FIG. 4(A)).

In order to suppress heat input to portions other than the irradiated portion, it is preferable to remove the epoxidized film compound by a pulse laser ablation technique that uses a pulsed laser.

The intensity of the laser beam is preferably 0.1 to 0.3 $J \cdot cm^{-2}$. If the intensity of the laser beam is less than 0.1 $J \cdot cm^{-2}$, the film compound having an epoxy group cannot be sufficiently removed; and if the intensity exceeds 0.3 $J \cdot cm^{-2}$, the glass portion of the epoxidized ITO glass plate 14 is also removed. Thus, neither case is preferable.

If the intensity of the laser beam is within the above-described range, the pulse width is preferably 5 to 50 ns.

Although the epoxidized film compound is removed by the pulse laser ablation technique in the embodiment described above, different energy irradiation such as electron beam or X-ray irradiation may be employed instead. Instead of conducting exposure through the mask, a pattern may be selectively drawn directly on the epoxidized ITO glass plate 14 with an electron beam or the like to remove the epoxidized film compound from the portions other than the patterned portion.

In a pattern-forming process according to a modification, as shown in FIG. 4(B), a photoinitiator is applied on a surface of the epoxidized ITO glass plate 14, and then the surface of the epoxidized ITO glass plate 14 is exposed through the mask 61 covering the pattern portion so as to conduct ring-open polymerization of the epoxy groups at the exposed portion. As a result, a patterned epoxidized ITO glass plate 64 having epoxy groups only in the pattern portion is prepared.

Examples of the usable photoinitiator include cationic photoinitiators such as a diaryliodonium salt or the like. Examples of the light source include a high-pressure mercury lamp and a xenon lamp.
(The Above is Related to Step B)

In step C (see FIG. 5), a film compound having an epoxy group which is the same as that used in step A is brought into contact with the n-type silicon fine particles 21 to prepare epoxidized n-type silicon fine particles 24 with a surface coated with a monomolecular film 23 of the film compound having an epoxy group.

There is no particular limitation as the diameter of the n-type silicon fine particles 21 that can be used and the particle diameter is preferably in the range of 1 nm to 100 nm. The absorption wavelength of the resulting optical sensor 1 can be controlled by the particle diameter of the n-type silicon fine particles 21 used.

The epoxidized n-type silicon fine particles 24 are made by dispersing the n-type silicon fine particles 21 into a reaction solution containing an alkoxysilane compound having an epoxy group, a condensation catalyst for accelerating condensation reaction between the alkoxysilyl groups and the hydroxyl groups 22 of the surfaces of the n-type silicon fine particles 21, and a nonaqueous organic solvent, and conducting reaction in air at room temperature.

The type of the alkoxysilane having an epoxy group compound that can be used in step C, type and combination of the condensation catalyst and the promoter, type of solvent, concentrations of alkoxysilane compound, condensation catalyst, and promoter, reaction conditions, and reaction time are the same as those in step A. The description therefor is thus omitted.

After the reaction, the condensation catalyst and the excess alkoxysilane compound, e.g., the unreacted material, remaining on the surface are removed by washing with a solvent to obtain the epoxidized n-type silicon fine particles 24 having surfaces coated with the monomolecular film 23 of the film compound having an epoxy group. A schematic view of a cross-sectional structure of the epoxidized n-type silicon fine particle 24 produced as such is shown in FIG. 5(B).

The same solvents for washing as that used in step A can be used as the solvent for washing.

After the reaction, leaving the epoxidized n-type silicon fine particles 24 in air without washing with a solvent causes part of the alkoxysilane compound remaining on the surface to hydrolyze by the moisture contained in air, and condensation reaction occurs between the silanol groups generated and the alkoxysilyl groups. As a result, a ultrathin polymer film composed of polysiloxane is formed on the surface of the epoxidized n-type silicon fine particle 24. Since this polymer film contains epoxy groups although not necessarily fixed on the surfaces of the epoxidized n-type silicon fine particles 24 via covalent bonds, the polymer film has reactivity comparable to that of the monomolecular film 23 of the film compound having an epoxy group for the epoxidized n-type silicon fine particles 24. Thus, not performing washing does not adversely affect the manufacturing steps described below.

It should be noted that although an alkoxysilane compound having an epoxy group is used in this embodiment, an alkoxysilane compound having an amino group at one end of a straight-chain alkylene group and an alkoxysilyl group at the other end may be used instead in the same way as step A.

Although the same alkoxysilane compound as that used in step A is used in this embodiment, a different alkoxysilane compound may be used instead. However, the alkoxysilane compound must have a functional group that forms bonds by reacting with the coupling reactive group contained in the coupling agent used in step C.

Although n-type silicon fine particles are used as the n-type semiconductor particles in this embodiment, any other desired n-type semiconductor fine particle may be used instead.

Although film compounds having an epoxy group are used as the first and second film compound, the film compounds may be the same compound or different compounds. The first and second film compounds may have different functional groups (e.g., one may have an epoxy group and the other may have an isocyanate group).

(The Above is Related to Step C)

In step D, epoxidized p-type silicon fine particles 25 are prepared. The particle diameter, film compounds that can be used, reaction conditions, and other factors are the same as those employed in step C except that p-type silicon fine particles are used as the raw material. Thus, detailed description therefor is omitted.

It should be noted that p-type silicon fine particles are used as the p-type semiconductor fine particles in this embodiment. However, any desired p-type semiconductor fine particles can be used instead.

(The Above is Related to Step D)

In step E, 2-methylimidazole is brought into contact with the surface of the patterned epoxidized ITO glass plate 62 to cause coupling reaction between the epoxy groups and the amino groups and to thereby prepare a reactive ITO glass plate 32.

2-Methylimidazole has an amino group and an imino group that are reactive with epoxy groups at the 1-position and the 3-position, respectively, and forms bonds by crosslinking reaction shown in Chem. 6 below:

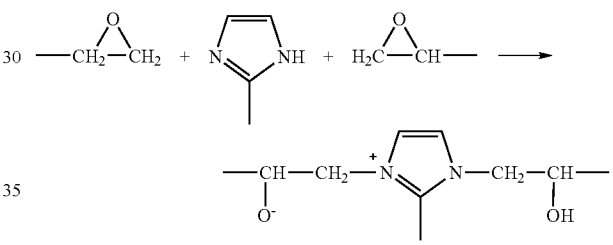

[Chem. 6]

The reactive ITO glass plate 32 is made by applying, on a surface of the epoxidized ITO glass plate 14, a reaction solution containing 2-methylimidazole and a solvent, and conducting reaction under heating. The application can be carried out by a desired process, such as a doctor blade process, a dip coating process, a spin coating process, a spraying process, or a screen-printing process.

In making a film precursor, any solvent that can dissolve 2-methylimidazole can be used; and a lower alcohol solvent such as isopropyl alcohol, ethanol, or the like is preferred from the standpoints of cost, volatility at room temperature, and toxicity.

The amount of 2-methylimidazole added, the concentration of the solution applied, the reaction temperature, and the reaction time are adequately adjusted according to the type of substrate and fine particles used, the film thickness of the optical sensor to be formed, and the like.

Figure 4:
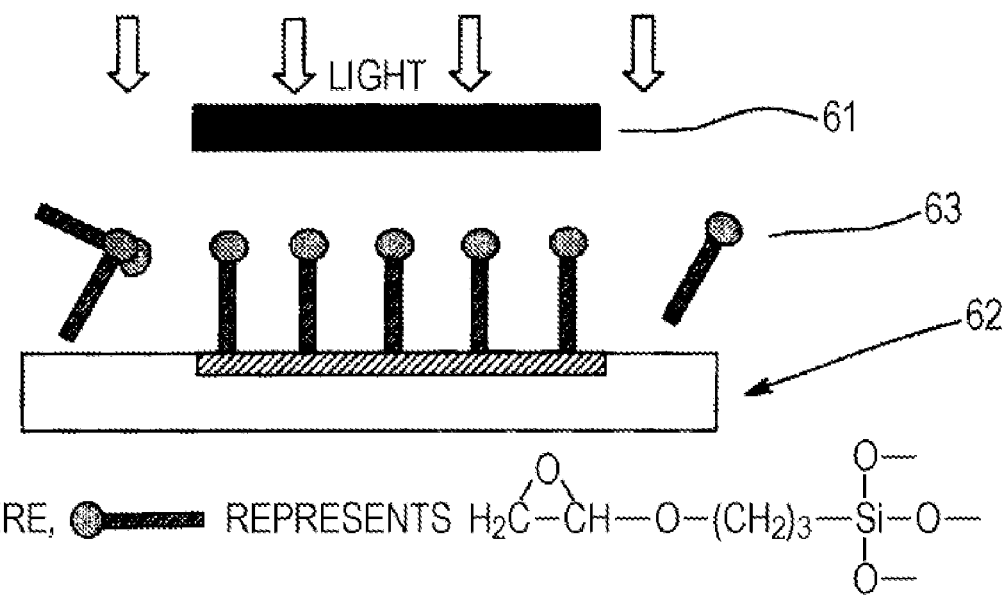
FIG. 4(A) is a schematic view enlarged to a molecular level for explaining a pattern forming process in the method for making the optical sensor and (B) is a schematic view enlarged to a molecular level for explaining a pattern forming process according to a modified embodiment.
Figure 4:
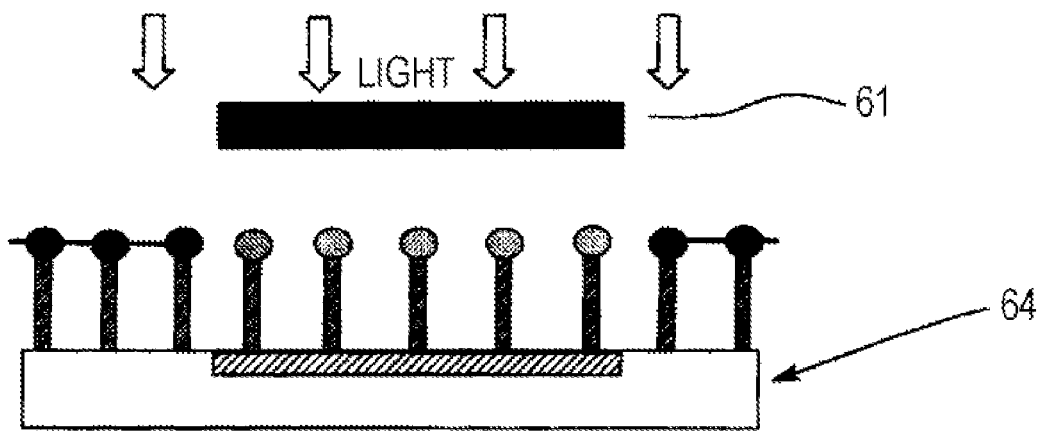

After the reaction, excess 2-methylimidazole, i.e., an unreacted material, remaining on the surface is removed by washing with a solvent so as to obtain a reactive ITO glass plate 32 having a surface coated with a reactive monomolecular film 31 (see FIG. 4).

A dispersion liquid of the epoxidized n-type silicon fine particles 24 is applied on the surface of the reactive ITO glass plate 32 thus obtained, and heated so as to allow coupling reaction between the epoxy groups on the epoxidized n-type silicon fine particles 21 and the imino groups derived from the 2-methylimidazole on the reactive monomolecular film 31 and to thereby fix the epoxidized n-type silicon fine particles

24 on the surface of the reactive ITO glass plate 32 by bonding. As a result, a fine particle film 1 having a single-layered fine particle layer is formed.

The heating temperature is preferably 100° C. to 200° C. At a heating temperature less than 100° C., progress of the coupling reaction requires a long time; in contrast, at a heating temperature exceeding 200° C., the monomolecular film having an epoxy group 23 and/or reactive monomolecular film 31 become decomposed and a homogeneous optical sensor 1 is not obtained.

After reaction, excess epoxidized n-type silicon fine particles 24 are removed by washing with a solvent such as water, alcohol, or the like.

Although 2-methylimidazole is used as the coupling agent in this embodiment, any desired imidazole derivative represented by Chem. 7 below can be used instead.

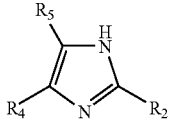

[Chem. 7]

Specific examples of the imidazole derivatives represented by Chem. 7 are indicated in items (31) to (38) below:
(31) 2-methylimidazole ($R_2$=Me, $R_4$=$R_5$=H)
(32) 2-undecylimidazole ($R_2$=$C_{11}H_{23}$, $R_4$=$R_5$=H)
(33) 2-pentadecylimidazole ($R_2$=$C_{15}H_{31}$, $R_4$=$R_5$=H)
(34) 2-methyl-4-ethylimidazole ($R_2$=Me, $R_4$=Et, $R_5$=H)
(35) 2-phenylimidazole ($R_2$=Ph, $R_4$=$R_5$=H)
(36) 2-phenyl-4-ethylimidazole ($R_2$=Ph, $R_4$=Et, $R_5$=H)
(37) 2-phenyl-4-methyl-5-hydroxymethylimidazole ($R_2$=Ph, $R_4$=Me, $R_5$=$CH_2OH$)
(38) 2-phenyl-4,5-bis(hydroxymethyl)imidazole ($R_2$=Ph, $R_4$=$R_5$=$CH_2OH$)

Note that Me, Et, and Ph respectively represent a methyl group, an ethyl group, and a phenyl group.

A compound such as an acid anhydride, e.g., phthalic anhydride or maleic anhydride, used as a curing agent for epoxy resins, dicyandiamide, or a phenol derivative, e.g., novolac, may be used as the coupling agent. In such a case, an imidazole derivative may be used as a catalyst for accelerating the coupling reaction.

In this embodiment, the case in which a film compound having an epoxy group as the functional group is used is described. In the case where a film compound having an amino or imino group as the functional group is used, a coupling agent having two or more epoxy groups or two or more isocyanate groups as the coupling reactive groups is used. Specific examples of the compound having an isocyanate group include hexamethylene-1,6-diisocyanate, toluene-2,6-diisocyanate, and toluene-2,4-diisocyanate.

The amount of the diisocyanate compound added is preferably 5 to 15 wt % of the epoxidized n-type silicon fine particles as with the case of 2-methylimidazole. In this case, the solvent that can be used in making the film precursor is, for example, an aromatic organic solvent such as xylene.

In the case where a film compound having a amino group is used, a compound having two or more epoxy groups, such as ethylene glycol diglycidyl ether, can be used as a cross-linking agent.
(The Above is Related to Step E)

In step F, 2-methylimidazole is brought into contact with surfaces of the epoxidized n-type silicon fine particles 24 so as to form reactive n-type silicon fine particles 42 having surfaces coated with a coating film of 2-methylimidazole fixed via bonds formed by coupling reaction between the epoxy groups and the amino groups derived from 2-methylimidazole.

The concentration of 2-methylimidazole used, reaction conditions, and other factors are the same as those employed in the preparation of the reactive ITO glass plate 32 in step E except that the epoxidized n-type silicon fine particles 24 are dispersed in a solution and heated instead of applying the solution. Thus, the detailed description is omitted. The coupling agents that can be used are also the same as those for preparation of the reactive ITO glass plate 42 in step E.
(The Above is Related to Step F)

In step G, 2-methylimidazole is brought into contact with surfaces of the epoxidized p-type silicon fine particles 25 in the same way as step F so as to form the reactive p-type silicon fine particles 43 having surfaces coated with a coating film of 2-methylimidazole fixed via bonds formed by coupling reaction between the epoxy groups and the amino groups derived from 2-methylimidazole.
(The Above is Related to Step G)

In step H, the epoxidized n-type silicon fine particles 24 are brought into contact with a surface of the reactive ITO glass plate 32 so as to form bonds through coupling reaction between epoxy groups and imino groups and fix the epoxidized n-type silicon fine particles 24 by bonding, and then the epoxidized n-type silicon fine particles 24 that are left unfixed and unbonded are removed.

Next, the reactive n-type silicon fine particles 42 are brought into contact with the epoxidized n-type silicon fine particles 24 to form bonds by coupling reaction between epoxy groups and imino groups and to thereby fix the reactive n-type silicon fine particles 42 by bonding. Then the reactive n-type silicon fine particles 42 that are left unfixed and unbonded are removed. Subsequently, these operations are alternately repeated to stack and fix the n-type silicon fine particles.

Since the reaction conditions in step H are the same as those in steps E to G, detailed description therefor is omitted.
(The Above is Related to Step H)

In step I, epoxidized p-type silicon fine particles 25 are brought into contact on the n-type silicon fine particle layer formed in step H so as to form bonds through coupling reaction between epoxy groups and imino groups and to thereby fix the epoxidized p-type silicon fine particles 25 by bonding. The epoxidized p-type silicon fine particles 25 that are left unfixed and unbonded are then removed.

Next, the reactive p-type silicon fine particles 43 are brought into contact therewith to form bonds by coupling reaction between epoxy groups and imino groups and to thereby fix the reactive p-type silicon fine particles 43 by bonding. Then the reactive p-type silicon fine particles 43 that are left unfixed and unbonded are removed. Subsequently, these operations are alternately repeated to stack and fix the p-type silicon fine particles.

Since the reaction conditions in step I are the same as those in steps E to H, detailed description therefor is omitted.
(The Above is Related to Step I)

In step J, a transparent electrode 51 as a rear electrode is formed on the silicon fine particle layers formed by steps H and I. The material and thickness of the transparent electrode 51 and the method for making the transparent electrode 51 are not particularly limited.
(The Above is Related to Step J)

Next, an optical sensor 2 according to a second embodiment of the present invention is described. As shown in FIG. 2, in the optical sensor 2, a fine particle layer composed of reactive n-type silicon fine particles 42 that are aligned is fixed on a surface of an epoxidized ITO glass plate (one example of a coated substrate) 14 by bonding, and a layer of epoxidized n-type silicon fine particles 24 is fixed thereon by bonding.

A layer of reactive p-type silicon fine particles 43 is fixed on the epoxidized n-type silicon fine particles 24 by bonding and a layer of epoxidized p-type silicon fine particles 25 is fixed thereon by bonding.

As shown in FIGS. 3(A), 3(B), 4(B), 5(A), and 5(B), a method for making the optical sensor 2 includes step A (see FIG. 3) of bringing a solution containing an alkoxysilane compound having an epoxy group (one example of the first film compound) into contact with a surface of an ITO glass plate (an example of the substrate) 11 so as to form bonds between the alkoxysilyl groups (one example of first bonding groups) and hydroxyl groups 12 of the surface of the ITO glass plate 11, and to thereby prepare an epoxidized ITO glass plate 14 (one example of the coated substrate); step B (see FIG. 4(A)) of performing a pattern forming process by irradiating the surface of the epoxidized ITO glass plate 14 with light through a mask 61 that covers a pattern portion (one example of energy irradiation) so as to form a patterned epoxidized ITO glass plate 62 in which epoxy groups remain only on the pattern portion; step C (see FIG. 5) of bringing an alkoxysilane compound having an epoxy group (one example of the second film compound) into contact with surfaces of n-type silicon fine particles (one example of n-type semiconductor fine particles) 21 so as to form bonds between the alkoxysilyl groups (one example of second bonding groups) and hydroxyl groups 22 on the surfaces of the n-type silicon fine particles 21 to thereby prepare epoxidized n-type silicon fine particles 24; step E of bringing 2-methylimidazole into contact with the surface of the patterned epoxidized ITO glass plate 22 to cause coupling reaction between the epoxy groups and the amino groups to thereby prepare a reactive ITO glass plate 32; step F of bringing 2-methylimidazole into contact with surfaces of the epoxidized n-type silicon fine particles 24 to cause coupling reaction between the epoxy groups and the amino groups to thereby prepare reactive n-type silicon fine particles 42; step G of bringing 2-methylimidazole into contact with surfaces of the epoxidized p-type silicon fine particles 25 to cause coupling reaction between the epoxy groups and the amino groups to thereby prepare reactive p-type silicon fine particles 43; step H of alternately bringing the reactive n-type silicon fine particles 42 and the epoxidized n-type silicon fine particles 24 into contact with the surface of the epoxidized ITO glass plate 14 so as to form bonds by coupling reaction between the epoxy groups and the imino groups (one example of second coupling reactive groups) to thereby fix the epoxidized n-type silicon fine particles 24 and the reactive n-type silicon fine particles 42 on the surface of the reactive ITO glass plate 32; step I of alternately bringing the reactive p-type silicon fine particles 43 and the epoxidized p-type silicon fine particles 25 into contact thereon so as to form bonds by coupling reaction between the epoxy groups and the imino groups (one example of second coupling reactive groups) to thereby fix the epoxidized p-type silicon fine particles 25 and the reactive p-type silicon fine particles 43; and step J of forming a transparent electrode 51 at the top.

Preparation of the epoxidized ITO glass plate 14, the epoxidized n-type silicon fine particles 24, the epoxidized p-type silicon fine particles 25, the reactive ITO glass plate 32, the reactive n-type silicon fine particles 42, and the reactive p-type silicon fine particles 43 and the reactions in steps A to J are the same as those of the optical sensor 1 according to the first embodiment. Thus, detailed description is omitted.

In the description above, the optical sensors 1 and 2 each having two layers of n-type silicon fine particles and two layers of p-type silicon fine particles between the transparent electrode and the rear electrode are described. Alternatively, an optical sensor having three or more layers of n-type silicon fine particles and three or more layers of p-type silicon fine particles between the transparent electrode and the rear electrode can be made by alternately stacking the coated n-type silicon fine particles 24 and the reactive n-type silicon fine particles 42 and by alternately stacking the coated p-type silicon fine particles 25 and the reactive p-type silicon fine particles 43 thereon.

The film compound used in each step and the combination of the coupling agents differ depending on which of the reactive ITO glass plate 32 and the epoxidized ITO glass plate 14 is used as the transparent electrode or whether the number of the n-type silicon fine particle layers stacked is an odd number or an even number.

FIG. 5 include schematic diagrams showing combinations of the film compounds and the coupling agents used in making the optical sensor in the following instances: (A) when a reactive ITO glass plate 32 is used as the transparent electrode and the number of n-type silicon fine particle layers stacked is an even number; (B) when a reactive ITO glass plate 32 is used as the transparent electrode and the number of n-type silicon fine particle layers stacked is an odd number; (C) when an epoxidized ITO glass plate 14 is used as the transparent electrode and the number of n-type silicon fine particle layers stacked is an even number; (D) when an epoxidized ITO glass plate 14 is used as the transparent electrode and the number of n-type silicon fine particle layers stacked is an odd number.

In FIG. 5, the symbols used to indicate functional groups and coupling reactive groups are as shown in Table 1 below.

TABLE 1

| First functional group | Second functional group | Third functional group | Fourth functional group |
| --- | --- | --- | --- |
| ● | ▲ | ■ | ▼ |
| First coupling reactive group | Second coupling reactive group | Third coupling reactive group | Fourth coupling reactive group |
| ∪ | ∨ | ⊔ | ⌴ |

Table 2 below show combinations of the functional groups used in the epoxidized ITO glass plate 14, the epoxidized n-type silicon fine particles 24, the epoxidized p-type silicon fine particles 25, the reactive ITO glass plate 32, the reactive n-type silicon fine particles 42, and the reactive p-type silicon fine particles 43, and coupling reactive groups used in the coupling agents in each of instances (A) to (D). Ordinal numbers (n-th) in Table 2 indicate the n-th (n is an integer of 1 to 4) film compound is used in making the epoxidized n-type silicon fine particles 24, the epoxidized p-type silicon fine particles 25, the reactive ITO glass plate 32, the reactive n-type silicon fine particles 42, and the reactive p-type silicon fine particles 43. Moreover, "m-th & n-th" means that the coupling reactive groups contained in the first to third coupling agents are the m-th and the n-th coupling reactive groups.

TABLE 2

|  | (a) | (b) | (c) | (d) |
|---|---|---|---|---|
| Coated n-type silicon fine particles (24a to d) | $2^{nd}$ | $2^{nd}$ | $1^{st}$ | 1st |
| Coated p-type silicon fine particles (25a to d) | $2^{nd}$ | $2^{nd}$ | $1^{st}$ | $1s^t$ |
| Reactive n-type silicon fine particles (42a to d) | $3^{rd}$ | $3^{rd}$ | $2^{nd}$ | 2nd |
| Reactive p-type silicon fine particles (43a to d) | $4^{th}$ | $4^{th}$ | $3^{rd}$ | 3rd |
| First coupling agent | 1st & 2nd | 1st & $2^{nd}$ | 1st & 2nd | 1st & 2nd |
| Second coupling agent | 2nd & 3rd | 2nd & $3^{rd}$ | 1st & $3^{rd}$ | 1st & 2nd |
| Third coupling agent | 2nd & 4th | 2nd & $4^{th}$ | — | 1st & $3^{rd}$ |

EXAMPLES

Examples conducted to confirm the effects and advantages of the present invention will now be described.

(1) Preparation of Epoxidized ITO Glass Plate

An ITO glass plate was prepared, washed, and thoroughly dried.

3-Glycidoxypropyltrimethoxysilane (Chem. 8, produced by Shin-Etsu Chemical Co., Ltd.) 0.99 parts by weight and dibutyltin bisacetylacetonate (condensation catalyst) 0.01 parts by weight were weighed and dissolved in 100 parts by weight of a hexamethyldisiloxane solvent to prepare a reaction solution.

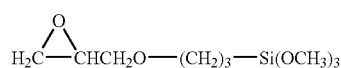

[Chem. 8]

The resulting reaction solution thus obtained was applied on the ITO-coated side of the ITO glass plate and allowed to react for about 2 hours in air (45% relative humidity).

Subsequently, the excess alkoxysilane compound and dibutyltin bisacetylacetonate were removed by washing with chloroform.

(2) Preparation of Patterned Epoxidized Glass Plate

The epoxidized glass plate prepared in (1) was irradiated with a KrF excimer laser beam (wavelength: 248 nm, pulse width: 10 ns, laser intensity: 0.15 J/cm²) to remove the monomolecular film having epoxy groups that coats portions other than the pattern portion by laser ablation. A patterned epoxidized glass plate could be prepared by this method.

Alternatively, a patterned epoxidized glass plate could be prepared by applying, on a surface of an epoxidized glass plate, Irgacure (trade name) 250 (a 3:1 mixture of (4 methylphenyl)[4-(2-methylpropyl)phenyl]iodonium hexafluorophosphate and propylene carbonate, produced by Ciba Specialty Chemicals) diluted with MEK, and irradiating the surface with far-ultraviolet through a mask that covers the pattern portion to be formed so as to allow ring-opening polymerization of the epoxy groups of the monomolecular film having epoxy groups that covers the portions other than the pattern portion.

(3) Preparation of Epoxidized n-Type Silicon Fine Particles

Anhydrous n-type silicon fine particles having a diameter of 100 nm were prepared and thoroughly dried.

3-Glycidoxypropyltrimethoxysilane (Chem. 8) 0.99 parts by weight and dibutyltin bisacetylacetonate (condensation catalyst) 0.01 parts by weight were weighed and dissolved in 100 parts by weight of a hexamethyldisiloxane solvent to prepare a reaction solution.

To the resulting solution, n-type silicon fine particles were mixed, and the resulting mixture was allowed to react for about 2 hours under stirring in air (45% relative humidity).

Subsequently, the excess alkoxysilane compound and dibutyltin bisacetylacetonate were removed by washing with trichlene.

(4) Preparation of Epoxidized p-Type Silicon Fine Particles

Epoxidized p-type silicon fine particles were prepared in the same way as (3) by using anhydrous p-type silicon fine particles having a particle diameter of 100 nm.

(5) Preparation of Reactive ITO Glass Plate

An ethanol solution of 2-methylimidazole was applied on a surface of the epoxidized ITO glass plate prepared in (2) and heated at 100° C. As a result, the epoxy groups reacted with the amino groups of 2-methylimidazole and a reactive ITO glass plate was obtained. The excess 2-methylimidazole was removed by washing with ethanol.

(6) Preparation of Reactive n-Type Silicon Fine Particles

The epoxidized n-type silicon fine particles prepared in (3) were dispersed in an ethanol solution of 2-methylimidazole and the resulting dispersion was heated at 100° C. As a result, the epoxy groups reacted with the amino groups of 2-methylimidazole and reactive n-type silicon fine particles were obtained. The excess 2-methylimidazole was then removed by washing with ethanol.

(7) Preparation of Reactive p-Type Silicon Fine Particles

Reactive p-type silicon fine particles were prepared in the same way as (5) by using the epoxidized p-type silicon fine particles prepared in (4).

(8) Preparation of Optical Sensor <1>

A dispersion liquid of the epoxidized n-type silicon fine particles prepared in (3) was applied on a surface of the reactive ITO glass plate prepared in (5) and heated at 100° C. After the reaction, the excess epoxidized n-type silicon fine particles were removed by washing with water.

Next, an ethanol dispersion liquid of the reactive n-type silicon fine particles prepared in (6) was applied and heated at 100° C. After the reaction, the excess reactive n-type silicon fine particles were removed by washing with water.

Next, an ethanol dispersion liquid of the epoxidized p-type silicon fine particles prepared in (3) was applied and heated at 100° C. After the reaction, the excess epoxidized p-type silicon fine particles were removed by washing with water.

Next, an ethanol dispersion liquid of the reactive p-type silicon fine particles prepared in (7) was further applied and heated at 100° C. After the reaction, the excess reactive p-type silicon fine particles were removed by washing with water.

Finally, a transparent electrode was formed by vapor deposition to form an optical sensor.

(9) Preparation of Optical Sensor <2>

An ethanol dispersion liquid of the reactive n-type silicon fine particles prepared in (6) was applied on a surface of the patterned epoxidized ITO glass plate prepared in (2) and heated at 100° C. After the reaction, the excess reactive n-type silicon fine particles were removed by washing with water.

Next, an ethanol dispersion liquid of the epoxidized n-type silicon fine particles prepared in (3) was applied and heated at 100° C. After the reaction, the excess epoxidized n-type silicon fine particles were removed by washing with water.

Next, an ethanol dispersion liquid of the reactive p-type silicon fine particles prepared in (7) was further applied and heated at 100° C. After the reaction, the excess reactive p-type silicon fine particles were removed by washing with water.

Next, an ethanol dispersion liquid of the epoxidized p-type silicon fine particles prepared in (3) was applied and heated at 100° C. After the reaction, the excess epoxidized p-type silicon fine particles were removed by washing with water.

Finally, a transparent electrode was formed by vapor deposition to form an optical sensor.

The invention claimed is:

1. A method for making an optical sensor in which a first fine particle layer composed of n-type semiconductor fine particles coated with a coating film composed of a second film compound having a second functional group and a second bonding group at respective two ends of the molecule is bonded and fixed on a pattern portion of a surface of a substrate coated with a coating film composed of a first film compound having a first functional group and a first bonding group at respective two ends of the molecule and in which a second fine particle layer composed of p-type semiconductor fine particles coated with a coating film composed of a third film compound having a third functional group and a third bonding group at respective two ends of the molecule is bonded and fixed on the first fine particle layer, the method comprising:

bringing a solution comprising the first film compound into contact with a surface of a substrate so as to form a coated substrate;

irradiating the coated substrate with an energy beam through a mask that covers a pattern portion so as to allow the coating film composed of the first film compound to remain on the pattern portion;

bringing a solution comprising the second film compound into contact with the n-type semiconductor fine particles so as to form coated n-type semiconductor fine particles;

bringing a solution comprising the third film compound into contact with the p-type semiconductor fine particles so as to form coated p-type semiconductor fine particles;

bringing a first coupling agent into contact with one of the coated substrate and the coated n-type semiconductor fine particles so as to fix the first coupling agent to the one of the coated substrate and the coated n-type semiconductor fine particles and thereafter bringing the first coupling agent into contact with the other of the coated substrate and the coated n-type semiconductor fine particles so as to fix and bond one n-type semiconductor fine particle layer composed of the coated n-type semiconductor fine particles on the surface of the coated substrate;

removing the coated n-type semiconductor fine particles that remain unfixed on the surface of the coated substrate;

bringing a second coupling agent into contact with one of the n-type semiconductor fine particle layer and the coated p-type semiconductor fine particles so as to fix the second coupling agent to the one of the n-type semiconductor fine particles and the coated p-type semiconductor fine particles and thereafter bringing the second coupling agent into contact with the other of the n-type semiconductor fine particle layer and the coated p-type semiconductor fine particles so as to fix and bond one p-type semiconductor fine particle layer composed of the coated p-type semiconductor fine particles on the n-type semiconductor fine particle layer; and removing the coated p-type semiconductor fine particles that remain unfixed on the surface of the n-type semiconductor fine particle layer.

2. The method for making the optical sensor according to claim 1, wherein irradiating the coated substrate with the energy beam includes removing the coating film of the first film compound from portions other than the pattern portion by laser ablation.

3. The method for making the optical sensor according to claim 1, wherein irradiating the coated substrate with the energy beam includes converting the first functional group in portions other than the pattern portion into a different functional group.

4. The method for making the optical sensor according to claim 1, wherein bringing the first coupling agent into contact with the coated substrate and the coated n-type semiconductor fine particles includes first bringing the first coupling agent into contact with the coated substrate so as to prepare a reactive substrate having a coating film composed of the first coupling agent, and then bringing the coated n-type semiconductor fine particles into contact with the reactive substrate so as to fix the coated n-type semiconductor fine particles on a surface of the reactive substrate; and wherein bringing the second coupling agent into contact with the n-type semiconductor fine particle layer and the coated p-type semiconductor fine particles includes first bringing the second coupling agent into contact with the coated p-type semiconductor fine particles so as to prepare reactive p-type semiconductor fine particles having a coated film of the second coupling agent, and then bringing the reactive p-type semiconductor fine particles into contact on the coated n-type semiconductor fine particles so as to fix the reactive p-type semiconductor fine particles.

5. The method for making the optical sensor according to claim 1, wherein bringing the first coupling agent into contact with the coated substrate and the coated n-type semiconductor fine particles includes first bringing the first coupling agent into contact with the n-type semiconductor fine particles so as to prepare reactive n-type semiconductor fine particles having a coating film of the first coupling agent, and bringing the reactive n-type semiconductor fine particles into contact with the coated substrate so as to fix the reactive n-type semiconductor fine particles on a surface of the coated substrate; and wherein bringing the second coupling agent into contact with the n-type semiconductor fine particle layer and the coated p-type semiconductor fine particles includes bringing the coated p-type semiconductor fine particles into contact on the reactive n-type semiconductor fine particles so as to fix the reactive p-type semiconductor fine particles.

6. The method for making the optical sensor according to claim 1, wherein the first to third film compounds are the same compound.

7. The method for making the optical sensor according to claim 1, further comprising removing the first to third film compounds that remain unreacted.

8. The method for making the optical sensor according to claim 1, wherein the first and second film compounds are alkoxysilane compounds, and each of the solutions further comprises at least one compound selected from the group consisting of a carboxylic acid metal salt, a carboxylate metal salt, a carboxylic acid metal salt polymer, a carboxylic acid metal salt chelate, a titanate, and a titanate chelate.

9. The method for making the optical sensor according to claim 1, wherein the first to third film compounds are alkoxysilane compounds, and each of the solutions further comprises at least one compound selected from the group consisting of a ketimine compound, an organic acid, an aldimine compound, an enamine compound, an oxazolidine compound, and an aminoalkylalkoxysilane compound.

10. The method for making the optical sensor according to claim 8, wherein at least one compound selected from the group consisting of a ketimine compound, an organic acid, an aldimine compound, an enamine compound, an oxazolidine compound, and an aminoalkylalkoxysilane compound is further comprised as a promoter.

11. The method for making the optical sensor according to claim 1, wherein bringing at least one of the first coupling agent and the second coupling agent into contact with the coated substrate causes a coupling reaction in which N—CH$_2$CH(OH) bonds are formed by reaction of amino or imino groups with epoxy groups.

12. The method for making the optical sensor according to claim 1, wherein bringing at least one of the first coupling agent and the second coupling agent into contact with the coated substrate causes a coupling reaction in which NH—CONH bonds are formed by reaction of amino or imino groups with isocyanate groups.

13. The method for making the optical sensor according to claim 1, wherein the first coupling agent has at least one first coupling reactive group that forms a bond by coupling reaction with the first functional group and at least one second coupling reactive group that forms a bond by coupling reaction with the second functional group.

14. The method for making the optical sensor according to claim 1, wherein the second coupling agent has at least one second coupling reactive group that forms a bond by coupling reaction with the second functional group and at least one third coupling reactive group that forms a bond by coupling reaction with the third functional group.

15. The method for making the optical sensor according to claim 1, further comprising forming a rear electrode on the p-type semiconductor fine particle layer.

16. The method for making the optical sensor according to claim 1, wherein all of the coating films of the first to third film compounds are monomolecular films.

17. A method for making an optical sensor in which the first to x-th (X is an even integer of 2 or more) semiconductor fine particle layers composed of n-type semiconductor fine particles are sequentially stacked in order on a pattern portion of a surface of a substrate coated with a coating film composed of a first film compound having a first functional group and a first bonding group at respective two ends of the molecule in a direction from the coated substrate side toward a rear electrode side; and in which the (x+1)-th to y-th (y is an integer satisfying y≧x+1) semiconductor fine particle layers composed of p-type semiconductor fine particles are sequentially stacked thereon in order, the method comprising:

bringing a solution comprising the first film compound into contact with a surface of a substrate so as to form a coated substrate;

irradiating the surface of the coated substrate with an energy beam through a mask that covers a pattern portion so as to allow the coating film composed of the first film compound to remain on the pattern portion;

bringing a solution comprising a second film compound into contact with at least a first portion of the n-type semiconductor fine particles so as to form coated n-type semiconductor fine particles;

bringing a solution comprising the second film compound into contact with at least a first portion of the p-type semiconductor fine particles so as to form coated p-type semiconductor fine particles;

bringing a first coupling agent into contact with the coated substrate so as to prepare a reactive coated substrate having a coating film of the first coupling agent on the coating film composed of the first film compound;

bringing a solution comprising a third film compound into contact with at least a second portion of the n-type semiconductor fine particles so as to bond the third film compound to the n-type semiconductor fine particles;

bringing a second coupling agent into contact with at least the second portion of the n-type semiconductor fine particles so as to prepare reactive n-type semiconductor fine particles having surfaces with a coating film composed of the second coupling agent;

bringing a solution comprising a fourth film compound into contact with at least a second portion of the p-type semiconductor fine particles so as bond the fourth film compound to the p-type semiconductor fine particles;

bringing a third coupling agent into contact with at least the second portion of the p-type semiconductor fine particles so as to prepare reactive p-type semiconductor fine particles having surfaces with a coating film composed of the third coupling agent;

bringing at least some of the coated n-type semiconductor fine particles into contact with the coating film of the first coupling agent so as to form a first semiconductor layer fixed to a surface of the reactive coated substrate;

alternately stacking the coated n-type semiconductor fine particles and the reactive n-type semiconductor fine particles on the first semiconductor layer and fixing them so as to form first to x-th semiconductor fine particle layers composed of n-type semiconductor fine particles that are sequentially stacked in order;

alternately stacking the coated p-type semiconductor fine particles and the reactive p-type semiconductor particles on the fine particle layer of the reactive n-type semiconductor fine particles located at the top of the first to x-th semiconductor fine particle so as to form (x+1)-th to y-th semiconductor fine particle layers composed of p-type semiconductor fine particles that are sequentially stacked in order; and forming a rear electrode on the top of the (x+1)-th to y-th semiconductor fine particle films.

18. The method for making the optical sensor according to claim 17, wherein the first to fourth film compounds are the same compound and the first to third coupling agents are the same compound.

19. The method for making the optical sensor according to claim 17, further comprising removing the first to fourth film compounds that remain unreacted.

20. The method for making the optical sensor according to claim 18, wherein further comprising removing the first to third film compounds that remain unreacted.

21. The method for making the optical sensor according to claim 17, wherein the first to fourth film compounds are alkoxysilane compounds, and each of the solutions further comprises at least one compound selected from the group consisting of a carboxylic acid metal salt, a carboxylate metal salt, a carboxylic acid metal salt polymer, a carboxylic acid metal salt chelate, a titanate, and a titanate chelate.

22. The method for making the optical sensor according to claim 17, wherein the first to third film compounds are alkoxysilane compounds, and each of the solutions further comprises at least one compound selected from the group consisting of a ketimine compound, an organic acid, an aldimine compound, an enamine compound, an oxazolidine compound, and an aminoalkylalkoxysilane compound.

23. A method for making an optical sensor in which the first to x-th (X is an odd integer of 1 or more) semiconductor fine particle layers composed of n-type semiconductor fine particles are sequentially stacked only on a pattern portion of a surface of a substrate coated with a coating film composed of a first film compound having a first functional group and a first bonding group at respective two ends of the molecule in a direction from the coated substrate side toward a rear electrode side and in which the (x+1)-th to y th (y is an integer satisfying y≧x+1) semiconductor fine particle layers composed of p-type semiconductor fine particles are further sequentially stacked thereon in order, the method comprising:

bringing a solution comprising the first film compound into contact with a surface of a substrate so as to form a coated substrate;

irradiating the surface of the coated substrate with an energy beam through a mask that covers a pattern portion so as to allow the coating film composed of the first film compound to remain on the pattern portion;

bringing a solution comprising a second film compound into contact with at least a first portion of the n-type semiconductor fine particles so as to form coated n-type semiconductor fine particles;

bringing a solution comprising the second film compound into contact with at least a first portion of the p-type semiconductor fine particles so as to form coated p-type semiconductor fine particles;

bringing a first coupling agent into contact with the coated substrate so as to prepare a reactive coated substrate having a coating film of the first coupling agent on the coating film composed of the first film compound;

bringing a solution comprising a third film compound into contact with at least a second portion of the n-type semiconductor fine particles so as to bond the third film compound to the n-type semiconductor fine particles;

bringing a second coupling agent into contact with at least the second portion of the n-type semiconductor fine particles so as to prepare reactive n-type semiconductor fine particles having surfaces with a coating film composed of the second coupling agent;

bringing a solution comprising a fourth film compound into contact with at least a second portion of the p-type semiconductor fine particles so as to bond the fourth film compound to the p-type semiconductor fine particles;

bringing a third coupling agent into contact with at least the second portion of the p-type semiconductor fine particles so as to prepare reactive p-type semiconductor fine particles having surfaces with a coating film composed of the third coupling agent;

bringing at least some of the coated n-type semiconductor fine particles into contact with the coating film of the first coupling agent so as to form a first semiconductor layer fixed to a surface of the reactive coated substrate;

alternately stacking the coated n-type semiconductor fine particles and the reactive n-type semiconductor fine particles on the first semiconductor layer and fixing them so as to form first to x-th semiconductor fine particle layers composed of n-type semiconductor fine particles which are sequentially stacked in order;

alternately stacking the reactive p-type semiconductor fine particles and the coated p-type semiconductor particles on the fine particle layer of the coated n-type semiconductor fine particle located at the top of the first to x-th semiconductor fine particle films and fixing them so as to form (x+1)-th to y-th semiconductor fine particle layers composed of p-type semiconductor fine particles that are sequentially stacked in order; and forming a rear electrode on the top of the (x+1)-th to y-th semiconductor fine particle films.

24. A method for making an optical sensor in which the first to x-th (X is an even integer of 2 or more) semiconductor fine particle layers composed of n-type semiconductor fine particles are sequentially stacked in order only on a pattern portion of a surface of a substrate coated with a coating film composed of a first film compound having a first functional group and a first bonding group at respective two ends of the molecule in a direction from the coated substrate side toward a rear electrode side and in which the (x+1)-th to y-th (y is an integer satisfying y≧x+1) semiconductor fine particle layers composed of p-type semiconductor fine particles that are sequentially stacked thereon in order, the method comprising:

bringing a solution comprising the first film compound into contact with a surface of a substrate so as to form a coated substrate;

irradiating the surface of the coated substrate with an energy beam through a mask that covers a pattern portion so as to allow the coating film composed of the first film compound to remain on the pattern portion;

bringing a solution comprising the first film compound into contact with at least a first portion of the n-type semiconductor fine particles so as to form coated n-type semiconductor fine particles;

bringing a solution comprising the first film compound into contact with at least a first portion of the p-type semiconductor fine particles so as to form coated p-type semiconductor fine particles;

bringing a solution comprising a second film compound into contact with at least a second portion of the n-type semiconductor fine particles so as to bond the second film compound to the n-type semiconductor fine particles;

bringing a first coupling agent into contact with the second film compound bonded to the at least the second portion of the n-type semiconductor fine particles so as to prepare reactive coated n-type semiconductor fine particles having surfaces with a coating film composed of the first coupling agent;

bringing a solution comprising a third film compound into contact with at least a second portion of the p-type semiconductor fine particles so as to bond the third film compound to the p-type semiconductor fine particles;

bringing a second coupling agent into contact with the third film compound bonded to the at least the second portion of the p-type semiconductor fine particles so as to prepare reactive coated p-type semiconductor fine particles having surfaces with a coating film composed of the second coupling agent;

alternately stacking the reactive coated n-type semiconductor fine particles and the coated n-type semiconductor fine particles on a surface of the coated substrate and fixing them so as to form first to x-th semiconductor fine particle layers composed of n-type semiconductor fine particles that are sequentially stacked in order;

alternately stacking the reactive coated p-type semiconductor fine particles and the coated p-type semiconductor particles on the fine particle layer of the coated n-type semiconductor fine particle located on the top of the first to x-th semiconductor fine particle films and fixing them so as to form (x+1)-th to y-th semiconductor fine particle layers composed of p-type semiconductor fine particles that are sequentially stacked in order; and forming a rear electrode on the top of the (x+1)-th to y-th semiconductor fine particle films.

25. The method for making the optical sensor according to claim 24, wherein the first to third film compounds are the same compound and the first and second coupling agents are the same compound.

26. A method for making an optical sensor in which the first to x-th (X is an odd integer of 1 or more) semiconductor fine particle layers composed of n-type semiconductor fine particles are sequentially stacked only on a pattern portion of a surface of a substrate coated with a coating film composed of a first film compound having a first functional group in a direction from the coated substrate side toward a rear electrode side; and in which the (x+1)-th to y-th (y is an integer satisfying y≧x+1) semiconductor fine particle layers composed of p-type semiconductor fine particles are sequentially stacked thereon in order, the method comprising:

bringing a solution comprising the first film compound into contact with a surface of a substrate so as to form a coated substrate;

irradiating the surface of the coated substrate with an energy beam through a mask that covers a pattern portion so as to allow the coating film composed of the first film compound to remain on the pattern portion;

bringing a solution comprising the first film compound into contact with at least a first portion of the n-type semiconductor fine particles so as to form coated n-type semiconductor fine particles;

bringing a solution comprising the first film compound into contact with at least a first portion of the p-type semiconductor fine particles so as to form coated p-type semiconductor fine particles;

bringing a solution comprising a second film compound into contact with at least a second portion of the n-type semiconductor fine particles so as to bond the second film compound to the n-type semiconductor fine particles;

bringing a first coupling agent into contact with the second film compound bonded to the at least the second portion of the n-type semiconductor fine particles so as to prepare reactive coated n-type semiconductor fine particles having surfaces with a coating film composed of the first coupling agent;

bringing a solution comprising a third film compound into contact with at least a second portion of the p-type semiconductor fine particles so as to bond the third film compound to the p-type semiconductor fine particles;

bringing a second coupling agent into contact with the third film compound bonded to the at least the second portion of the p-type semiconductor fine particles so as to prepare reactive coated p-type semiconductor fine particles having surfaces with a coating film composed of the second coupling agent;

alternately stacking the reactive coated n-type semiconductor fine particles and the coated n-type semiconductor fine particles on a surface of the coated substrate and fixing them so as to form first to x-th semiconductor fine particle layers composed of n-type semiconductor fine particles that are sequentially stacked in order;

alternately stacking the coated p-type semiconductor fine particles and the reactive coated p-type semiconductor particles on the fine particle layer of the reactive n-type semiconductor fine particles located on the top of the first to x-th semiconductor fine particle films and fixing them so as to form (x+1)-th to y-th semiconductor fine particle layers composed of p-type semiconductor fine particles that are sequentially stacked in order; and forming a rear electrode on the top of the (x+1)-th to y-th semiconductor fine particle films.

* * * * *

UNITED STATES PATENT AND TRADEMARK OFFICE
CERTIFICATE OF CORRECTION

PATENT NO.        : 8,409,910 B2
APPLICATION NO.   : 12/593574
DATED             : April 2, 2013
INVENTOR(S)       : Ogawa It is certified that error appears in the above-identified patent and that said Letters Patent is hereby corrected as shown below:

On the Title Page, Item (56), under "FOREIGN PATENT DOCUMENTS", in Column 2, Line 7, delete "JP 2007-173518 A 7/2007".

On the Title Page, Item (57), under "ABSTRACT", in Column 2, Lines 4-14, delete "In an optical.....................agent.", therefor and insert the same at line 3 after "are provided." as a continuation of the paragraph.

In the Specification:

In Column 1, Line 24, delete "7-142757" and insert -- 7-142757. --, therefor.

In Column 1, Lines 26-28, delete "DISCLOSURE OF INVENTION
Problems to be Solved by the Invention" and insert -- SUMMARY --, therefor.

In Column 1, Line 43, delete "Means for Solving the Problems".

In Column 4, Line 63, delete "(X" and insert -- (x --, therefor.

In Column 6, Line 25, delete "(X" and insert -- (x --, therefor.

In Column 7, Line 66, delete "(X" and insert -- (x --, therefor.

In Column 9, Line 19, delete "(X" and insert -- (x --, therefor.

In Column 11, Line 30, delete "Effect of the Invention".

In Column 11, Line 32, delete "in claims 1 to 10" and insert -- herein --, therefor.

In Column 11, Lines 33-34, delete "in claims 11 to 32" and insert -- herein --, therefor.

Signed and Sealed this
Sixteenth Day of July, 2013

Teresa Stanek Rea
*Acting Director of the United States Patent and Trademark Office*

CERTIFICATE OF CORRECTION (continued)
U.S. Pat. No. 8,409,910 B2

In Column 11, Line 52, delete "OF" and insert -- OF THE --, therefor.

In Column 12, Lines 17-18, delete "BEST MODES FOR CARRYING OUT THE INVENTION" and insert -- DETAILED DESCRIPTION --, therefor.

In Column 13, Line 24, delete "particles" and insert -- particles 24 --, therefor.

In Column 20, Line 30, in [Chem. 6], delete " " and insert --  --, therefor.

In Column 22, Line 12, delete "ITO glass plate 42" and insert -- ITO glass plate 32 --, therefor.

In the Claims:

In Column 29, Line 35, in Claim 17, delete "(X" and insert -- (x --, therefor.

In Column 30, Line 62, in Claim 23, delete "(X" and insert -- (x --, therefor.

In Column 31, Line 2, in Claim 23, delete "y th" and insert -- y-th --, therefor.

In Column 31, Line 64, in Claim 24, delete "(X" and insert -- (x --, therefor.

In Column 32, Line 65, in Claim 26, delete "(X" and insert -- (x --, therefor.

UNITED STATES PATENT AND TRADEMARK OFFICE
CERTIFICATE OF CORRECTION

PATENT NO. : 8,409,910 B2
APPLICATION NO. : 12/593574
DATED : April 2, 2013
INVENTOR(S) : Kazufumi Ogawa It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 571 days.

Signed and Sealed this
First Day of September, 2015

Michelle K. Lee
*Director of the United States Patent and Trademark Office*